United States Patent
Barth, Jr. et al.

(10) Patent No.: US 9,564,445 B2
(45) Date of Patent: Feb. 7, 2017

(54) DUMMY GATE STRUCTURE FOR ELECTRICAL ISOLATION OF A FIN DRAM

(71) Applicant: International Business Machines Corporation, Armonk, NY (US)

(72) Inventors: John E. Barth, Jr., Williston, VT (US); Kangguo Cheng, Schenectady, NY (US); Bruce B. Doris, Brewster, NY (US); Herbert L. Ho, New Windsor, NY (US); Ali Khakifirooz, Mountain View, CA (US); Babar A. Khan, Ossining, NY (US); Shom Ponoth, Gaithersburg, MD (US); Kern Rim, Yorktown Heights, NY (US); Kehan Tian, Poughkeepsie, NY (US); Reinaldo A. Vega, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/159,030

(22) Filed: Jan. 20, 2014

(65) Prior Publication Data
US 2015/0206885 A1    Jul. 23, 2015

(51) Int. Cl.
*H01L 27/108*    (2006.01)
*H01L 29/06*    (2006.01)
(Continued)

(52) U.S. Cl.
CPC ....... *H01L 27/10879* (2013.01); *H01L 21/283* (2013.01); *H01L 21/76224* (2013.01);
(Continued)

(58) Field of Classification Search
CPC ............... H01L 27/10826; H01L 27/10829; H01L 27/1087; H01L 27/10879; H01L 29/0653; H01L 29/41783; H01L 29/41791; H01L 29/6681; H01L 21/283; H01L 21/76224; H01L 27/10867; H01L 29/66181; H01L 29/785; H01L 29/945
See application file for complete search history.

(56) References Cited

U.S. PATENT DOCUMENTS

| | | |
|---|---|---|
| 6,764,884 B1 | 7/2004 | Yu et al. |
| 7,186,599 B2 | 3/2007 | Ahmed et al. |
| 7,317,230 B2 | 1/2008 | Lee et al. |
| 7,501,674 B2 | 3/2009 | Lee et al. |
| 7,521,301 B2 | 4/2009 | Lee et al. |
| 7,834,395 B2 | 11/2010 | Temmler et al. |

(Continued)

OTHER PUBLICATIONS

U.S. Office Action dated Oct. 11, 2016 received in U.S. Appl. No. 14/874,389.

*Primary Examiner* — A. Sefer
*Assistant Examiner* — Benjamin Tzu-Hung Liu
(74) *Attorney, Agent, or Firm* — Scully, Scott, Murphy & Presser, P.C.; Steven J. Meyers

(57) ABSTRACT

Trench capacitors can be formed between lengthwise sidewalls of semiconductor fins, and source and drain regions of access transistors are formed in the semiconductor fins. A dummy gate structure is formed between end walls of a neighboring pair of semiconductor fins, and limits the lateral extent of raised source and drain regions that are formed by selective epitaxy. The dummy gate structure prevents electrical shorts between neighboring semiconductor fins. Gate spacers can be formed around gate structures and the dummy gate structures. The dummy gate structures can be replaced with dummy replacement gate structures or dielectric material portions, or can remain the same without substitution of any material. The dummy gate structures may consist of at least one dielectric material, or may include electrically floating conductive material portions.

10 Claims, 31 Drawing Sheets

(51) Int. Cl.
*H01L 29/417* (2006.01)
*H01L 29/66* (2006.01)
*H01L 29/78* (2006.01)
*H01L 29/94* (2006.01)
*H01L 21/283* (2006.01)
*H01L 21/762* (2006.01)

(52) U.S. Cl.
CPC .... *H01L 27/1087* (2013.01); *H01L 27/10826* (2013.01); *H01L 27/10829* (2013.01); *H01L 27/10867* (2013.01); *H01L 29/0653* (2013.01); *H01L 29/41783* (2013.01); *H01L 29/41791* (2013.01); *H01L 29/6681* (2013.01); *H01L 29/66181* (2013.01); *H01L 29/785* (2013.01); *H01L 29/945* (2013.01)

(56) References Cited

U.S. PATENT DOCUMENTS

| | | | |
|---|---|---|---|
| 7,863,136 B2 | 1/2011 | Goldbach et al. | |
| 7,968,442 B2 | 6/2011 | Kang et al. | |
| 9,136,175 B2* | 9/2015 | Wei | H01L 21/76224 |
| 2008/0111194 A1* | 5/2008 | Kawakita | H01L 29/7851 |
| | | | 257/365 |
| 2008/0185650 A1 | 8/2008 | Chen et al. | |
| 2009/0137093 A1* | 5/2009 | Lin | H01L 27/10876 |
| | | | 438/421 |
| 2011/0248326 A1* | 10/2011 | Kanakasabapathy | H01L 21/845 |
| | | | 257/300 |
| 2012/0068237 A1* | 3/2012 | Booth, Jr. | H01L 21/84 |
| | | | 257/296 |
| 2016/0268392 A1 | 9/2016 | Zhu | |

* cited by examiner

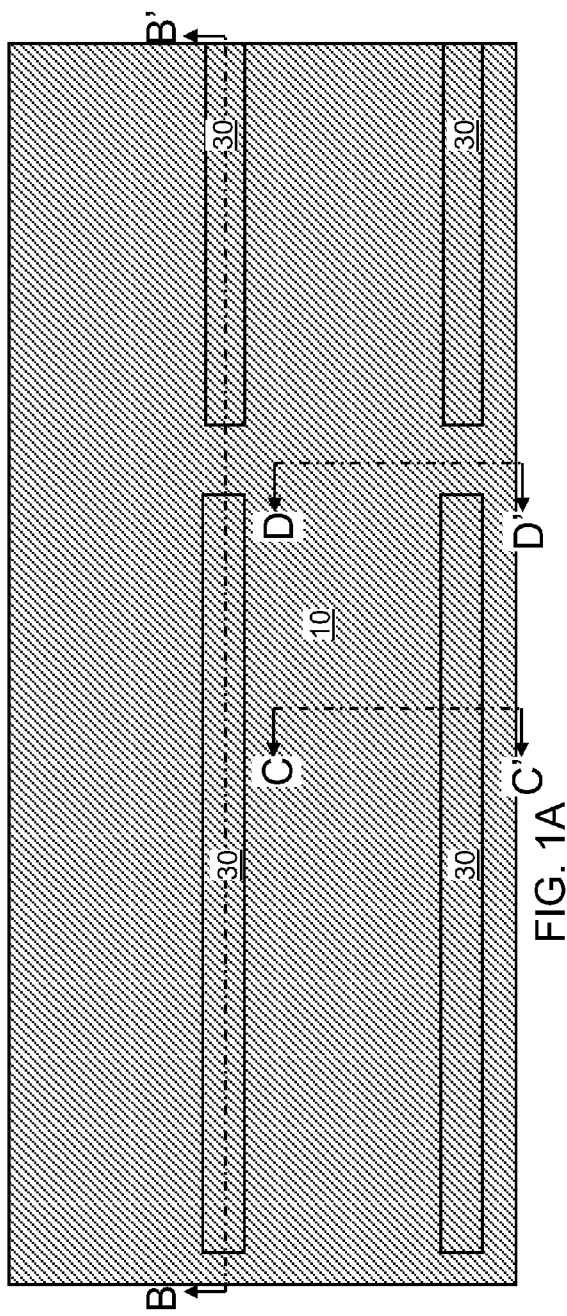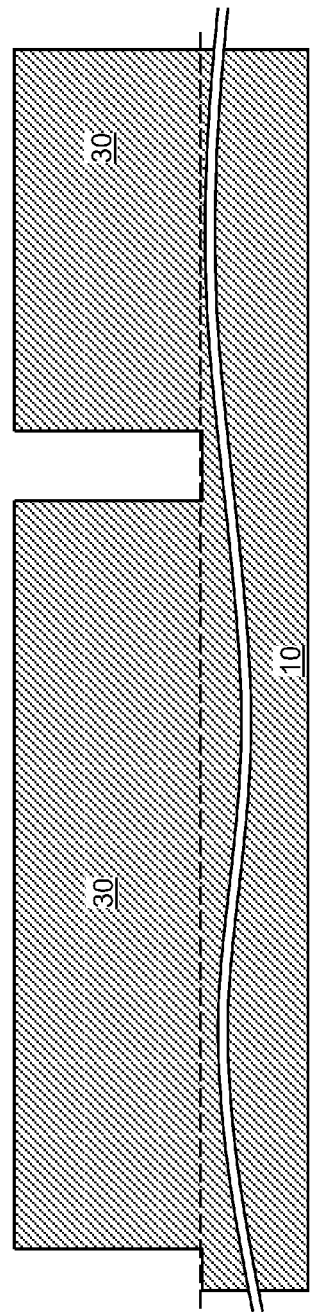
FIG. 1A
FIG. 1B

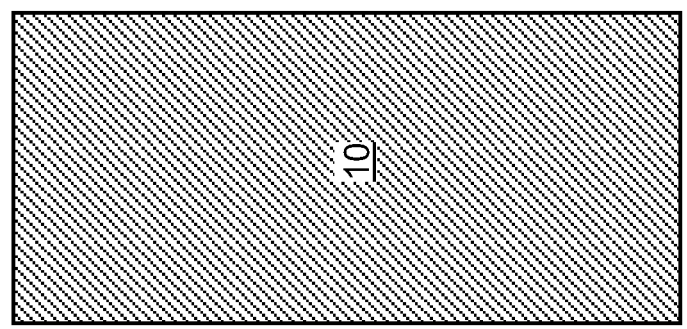
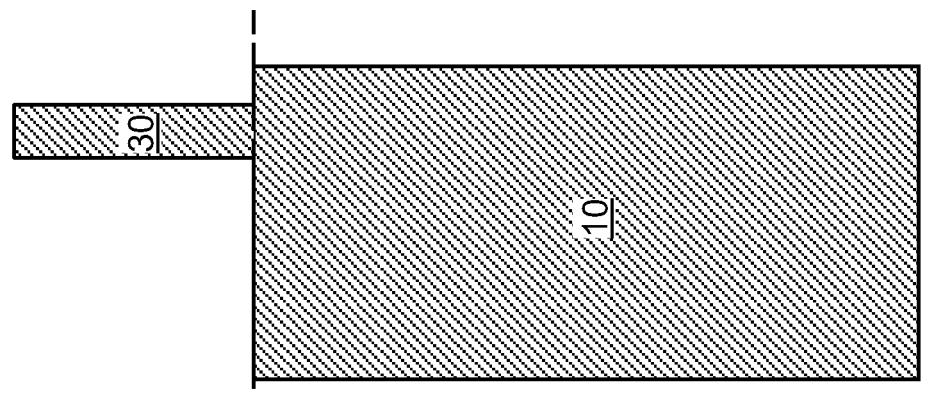
FIG. 1D
FIG. 1C

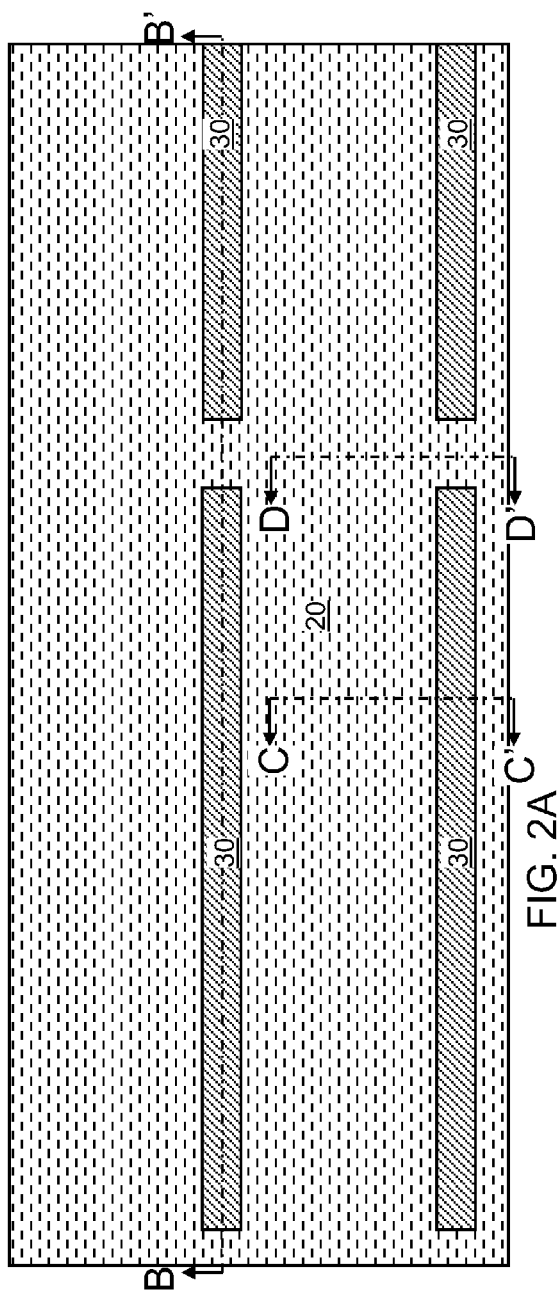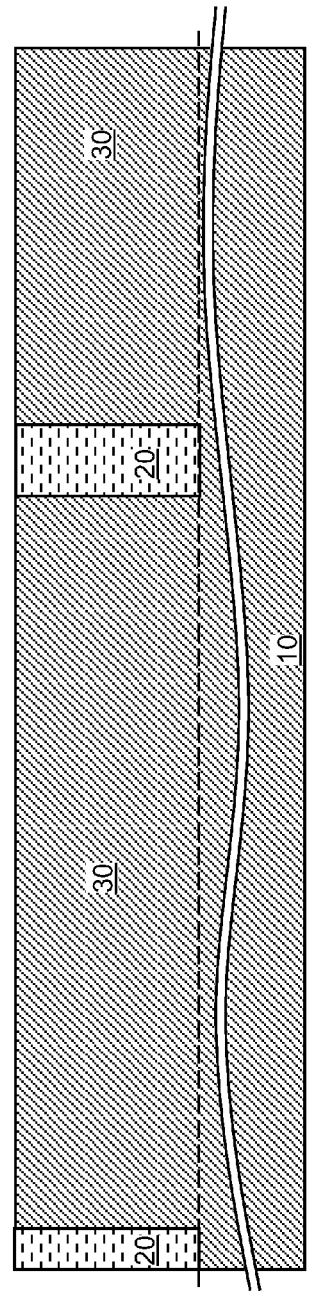

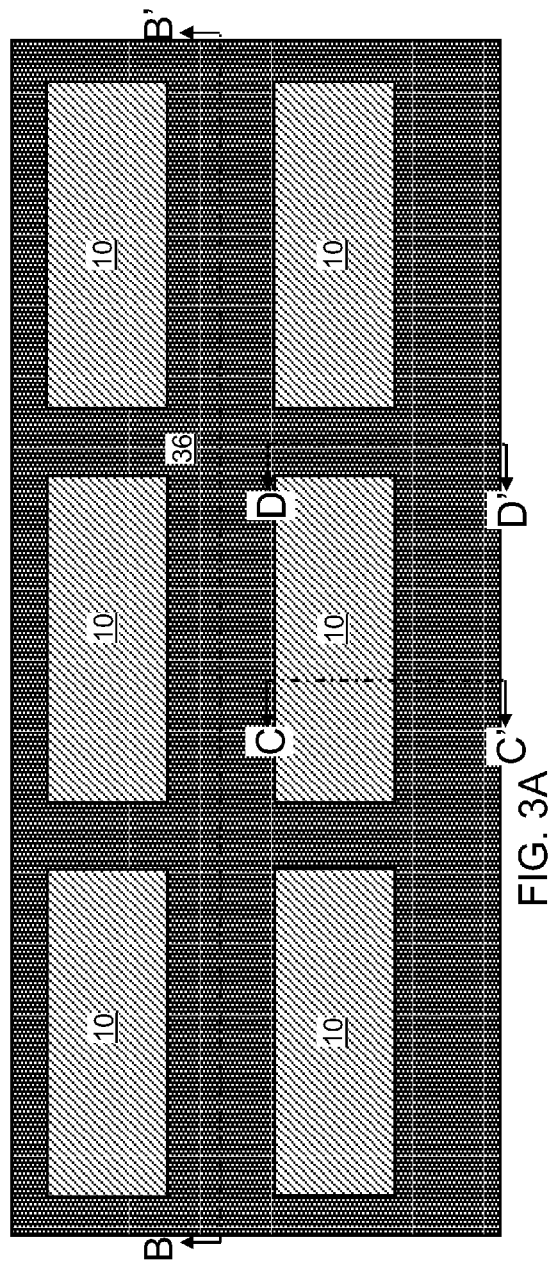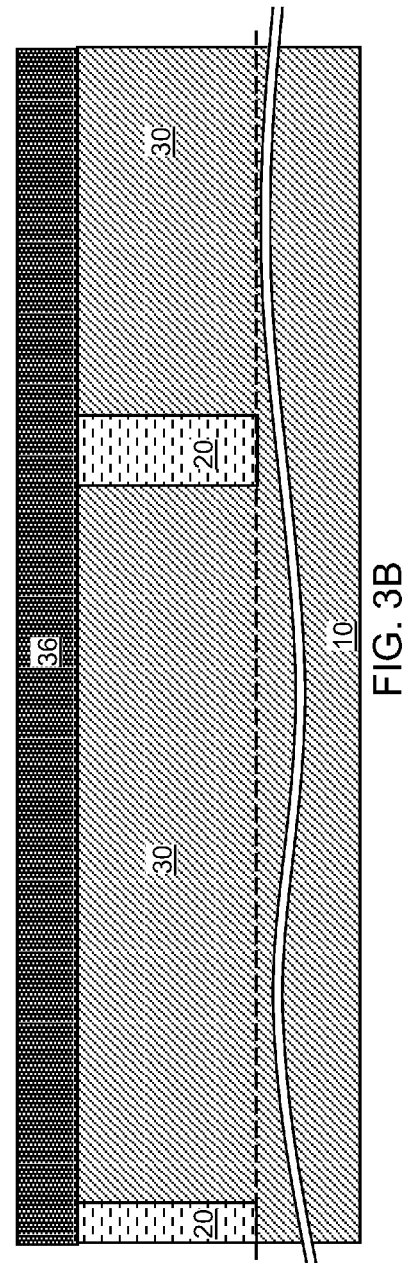

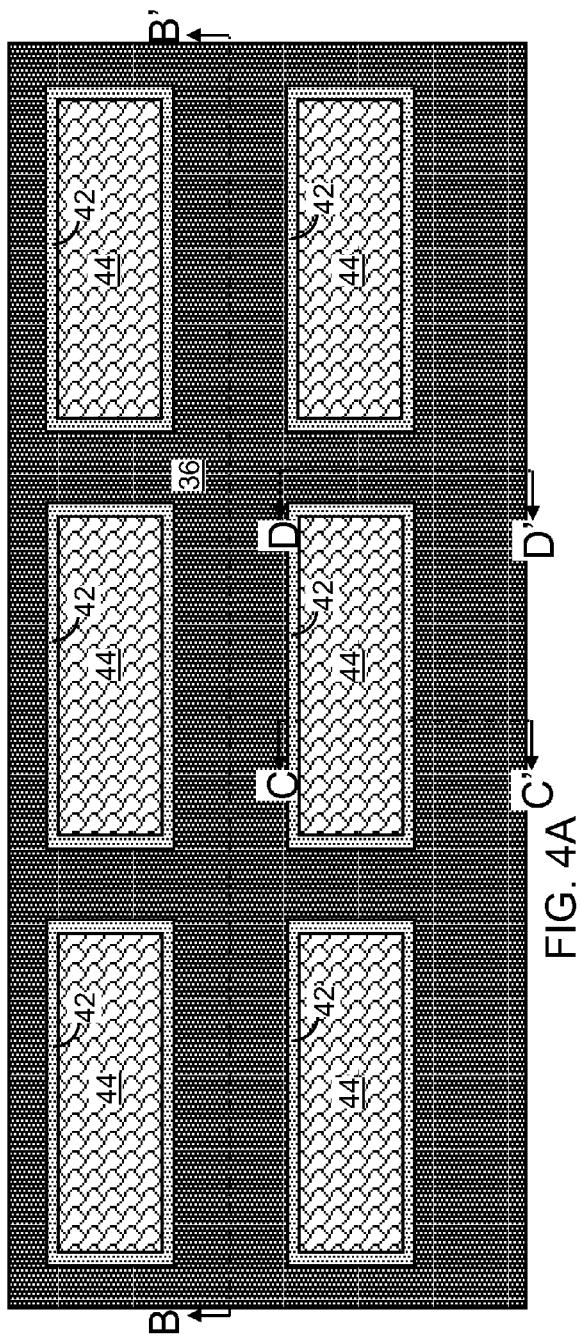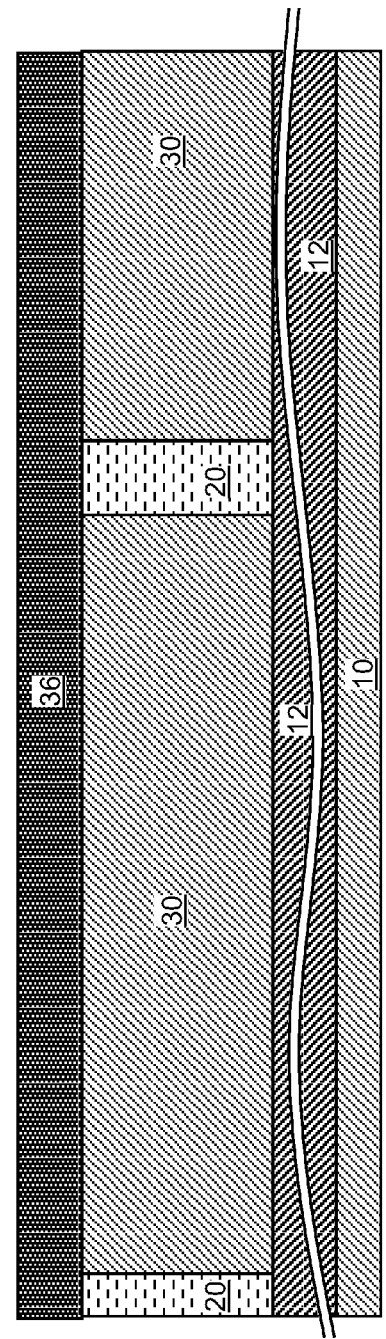

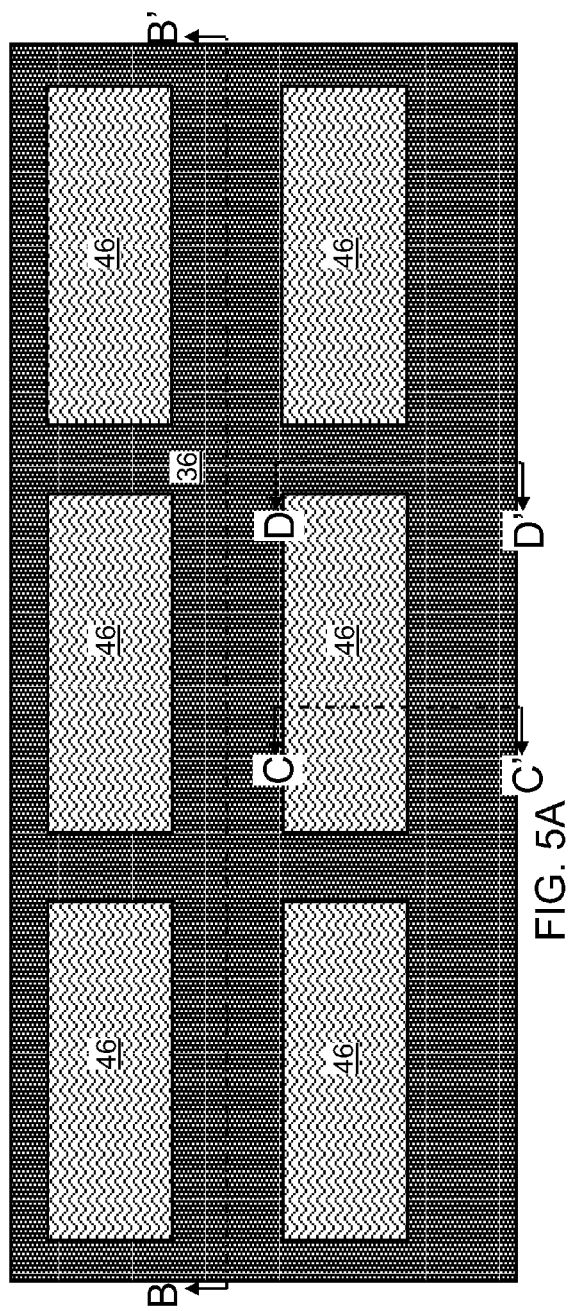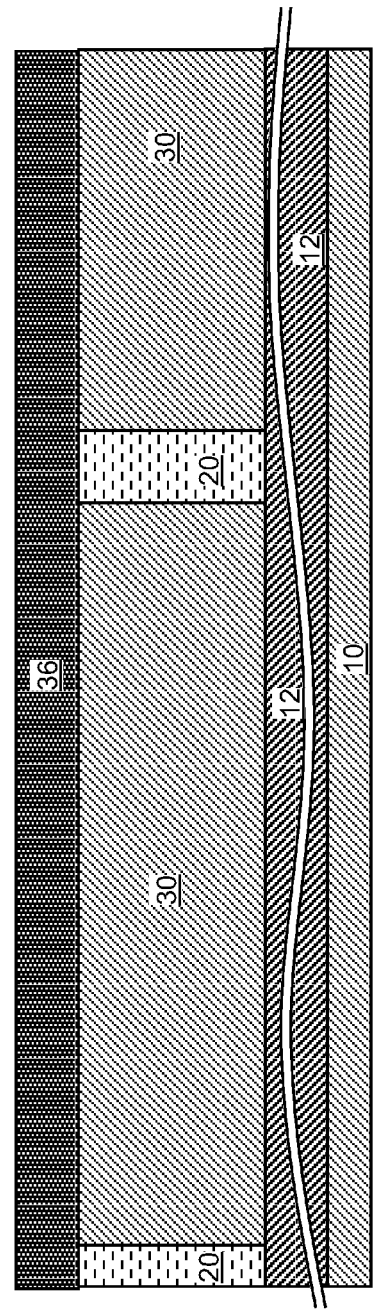
FIG. 5A
FIG. 5B

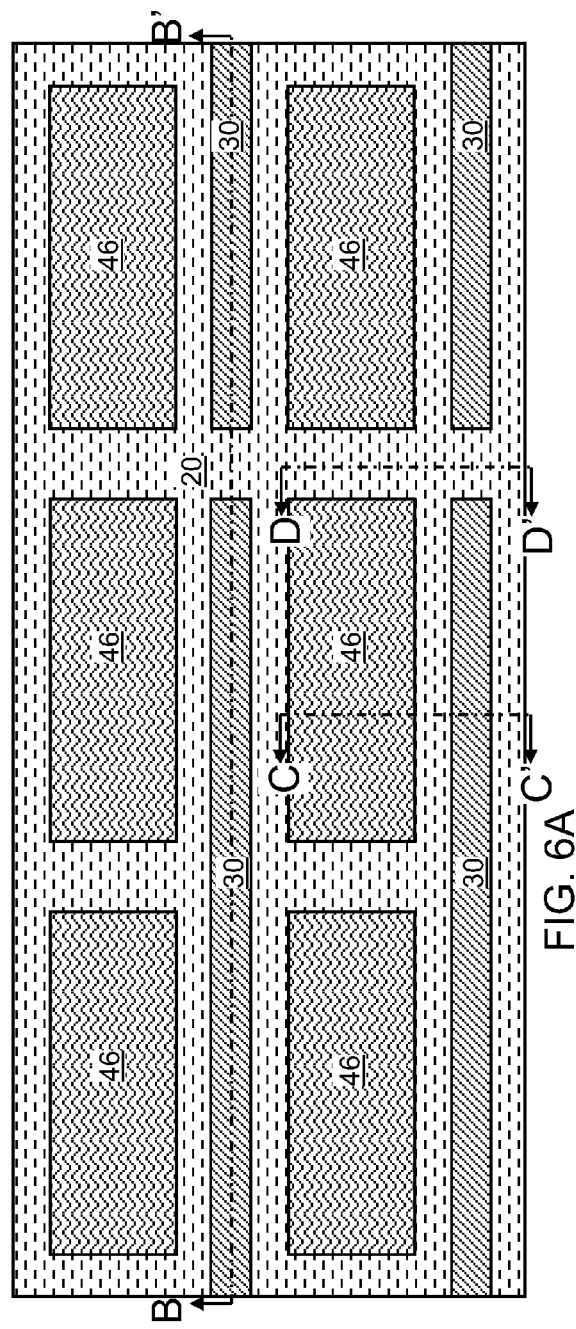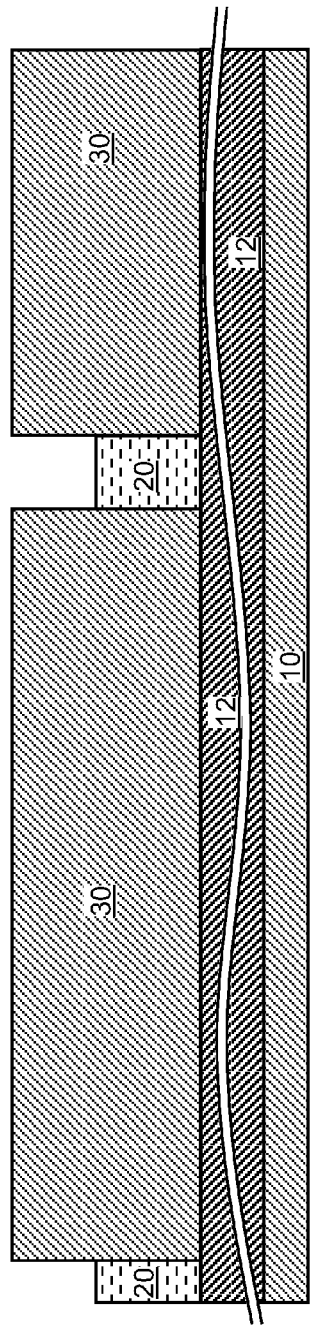

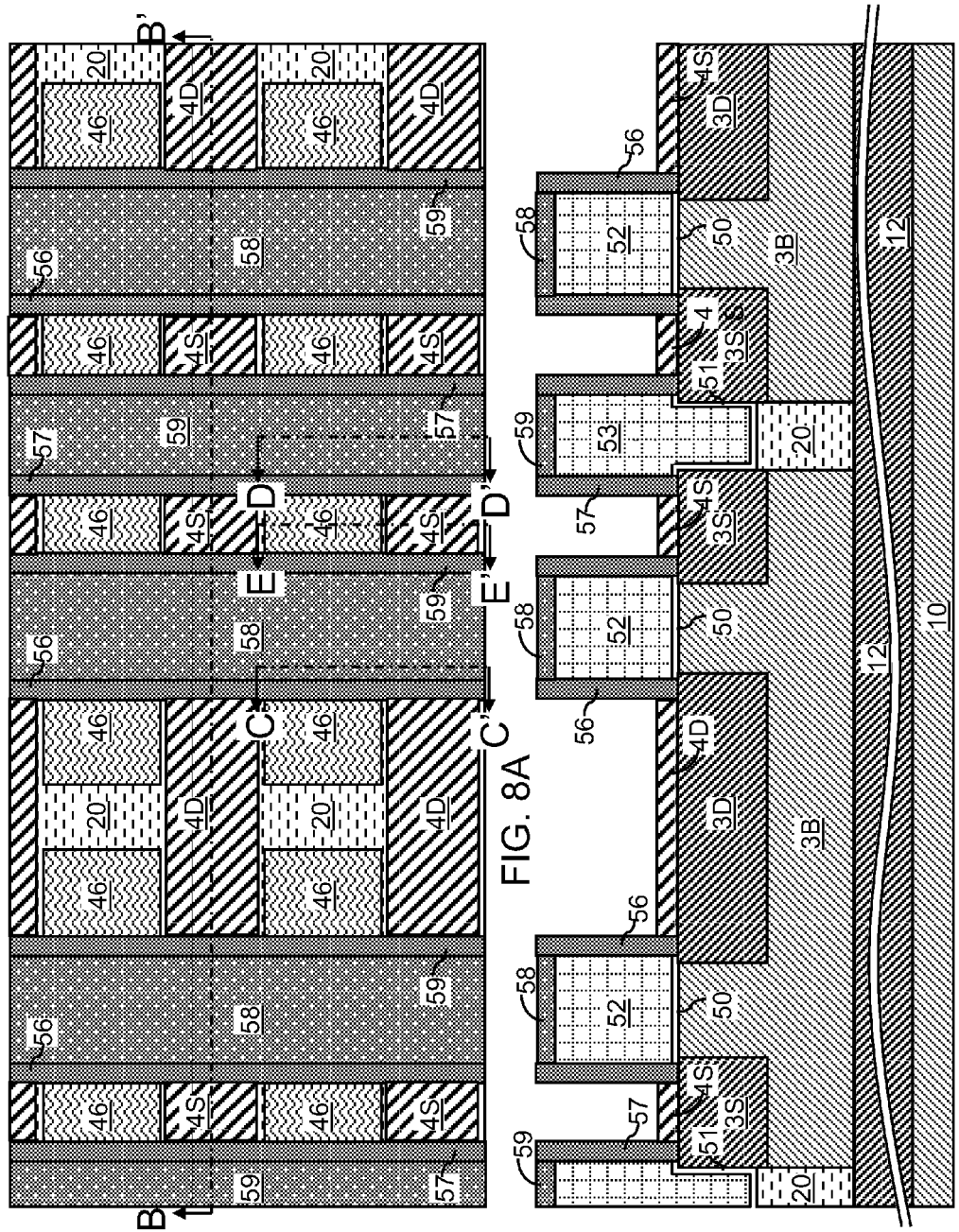

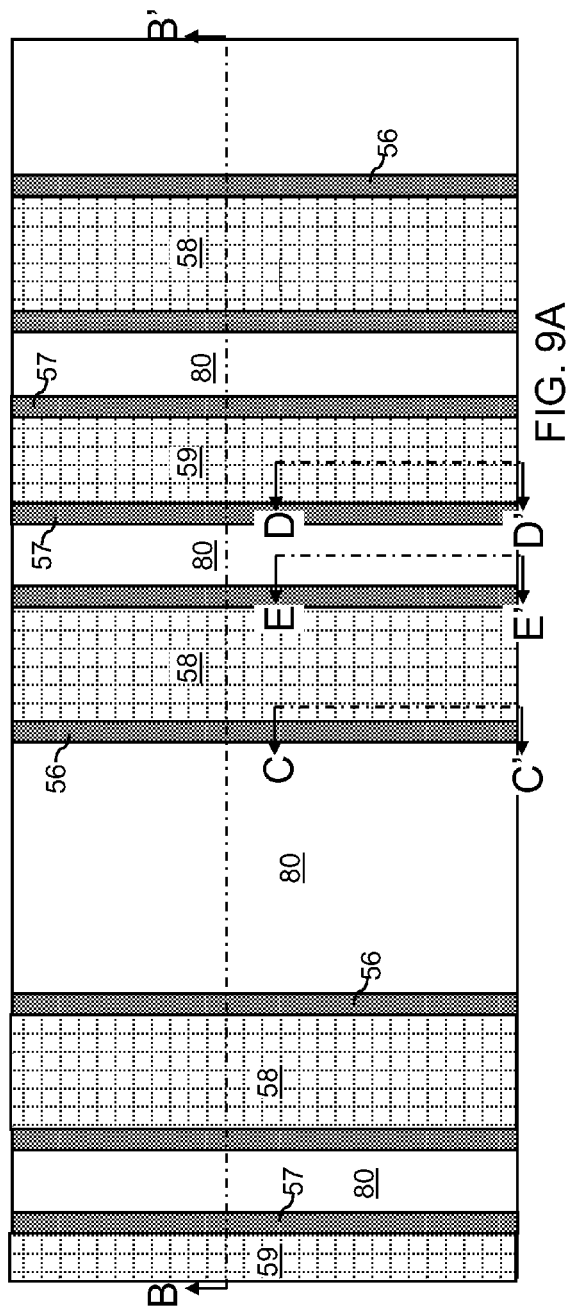
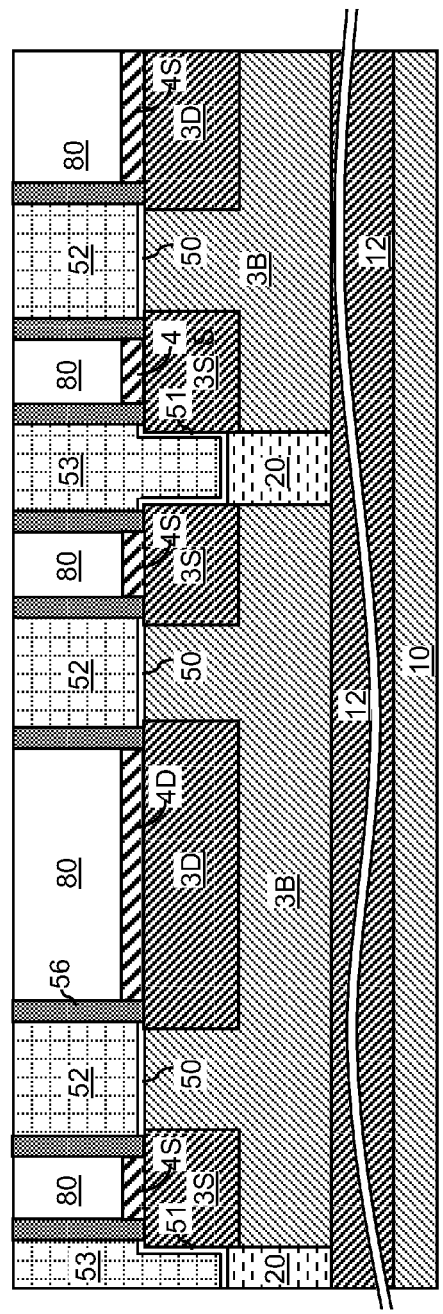
FIG. 9A
FIG. 9B

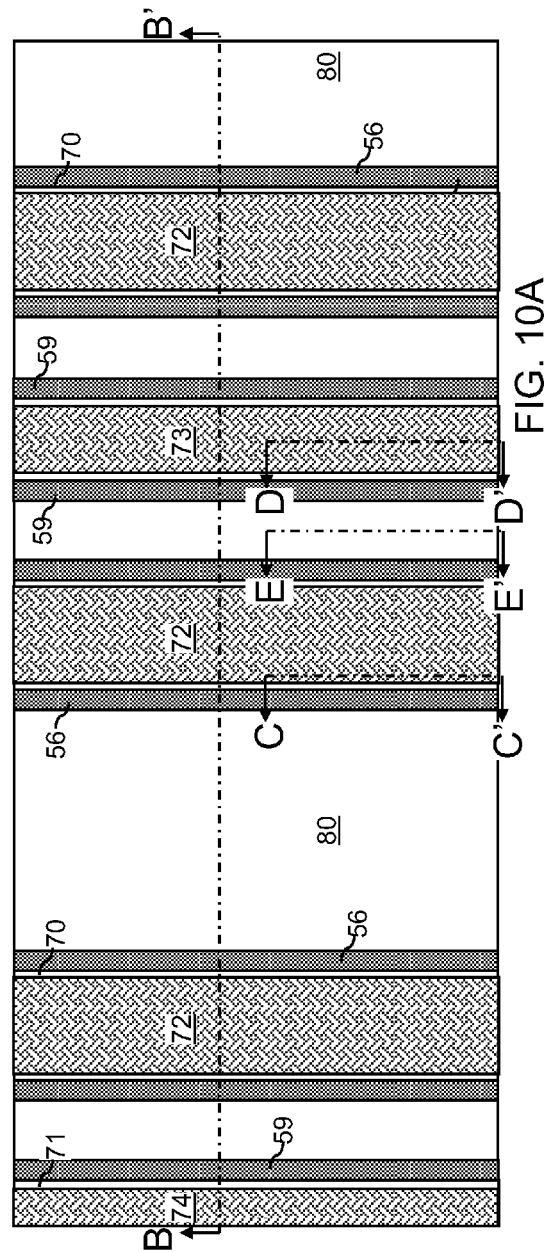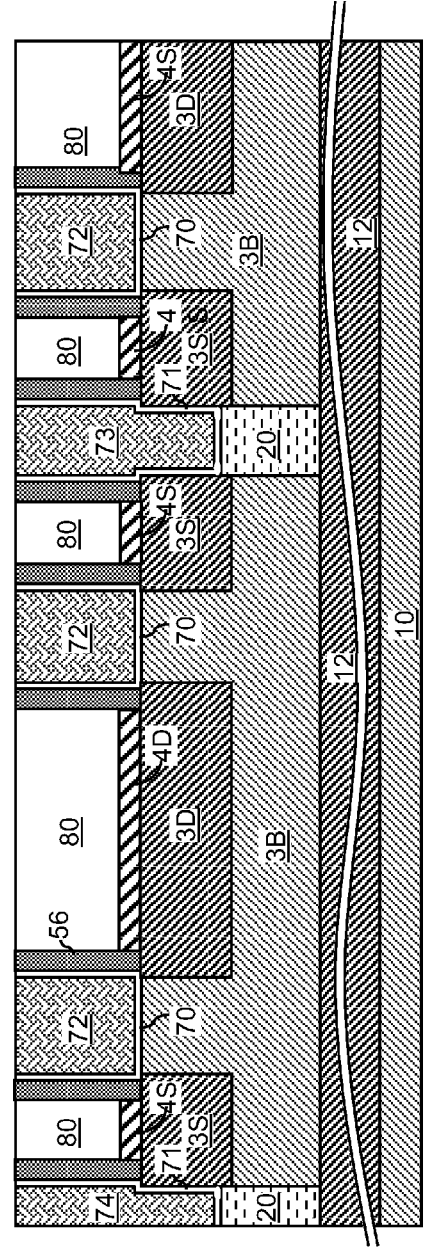
FIG. 10A
FIG. 10B

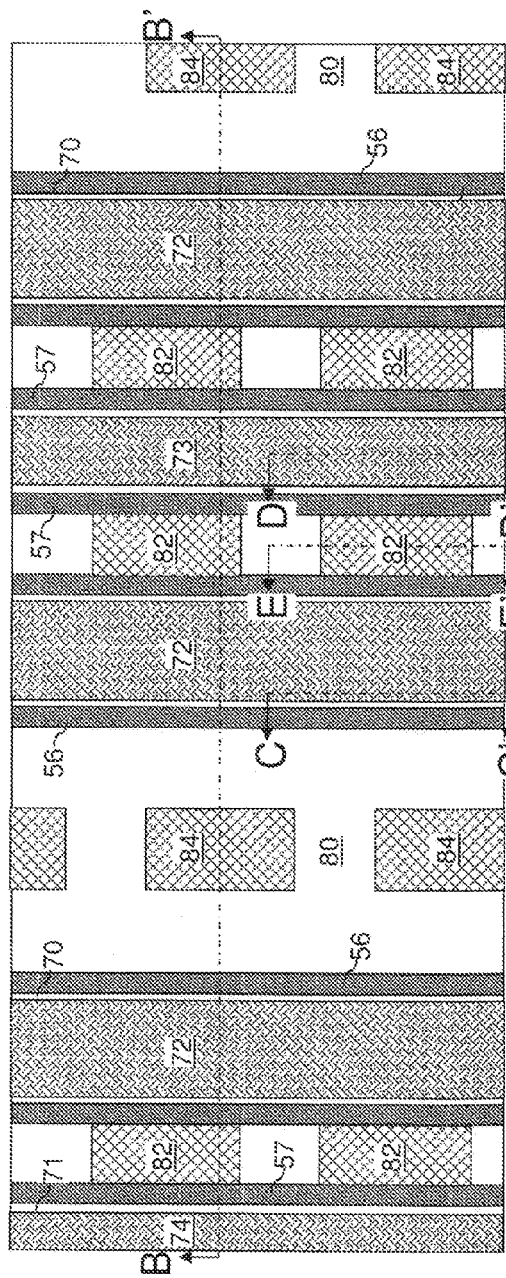
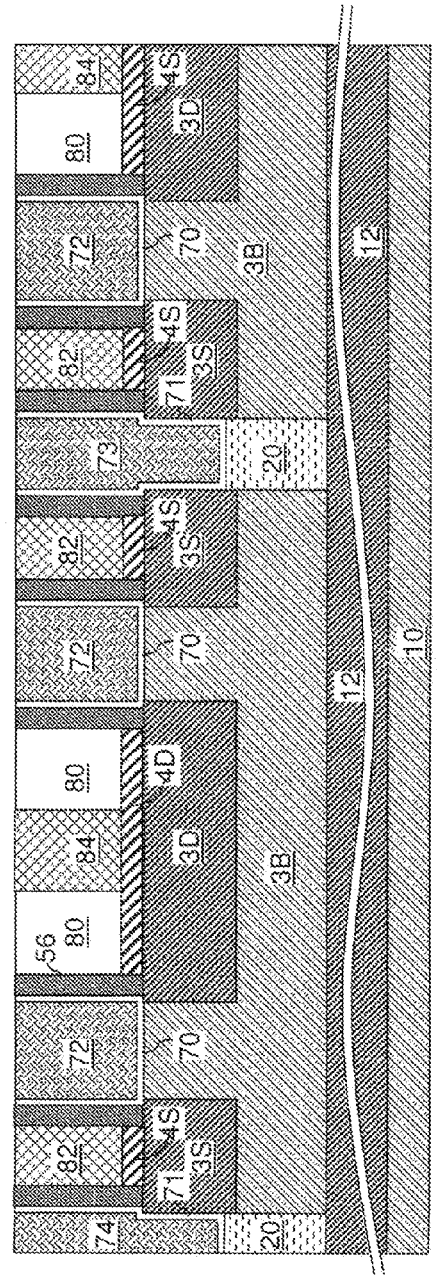
FIG. 11A
FIG. 11B

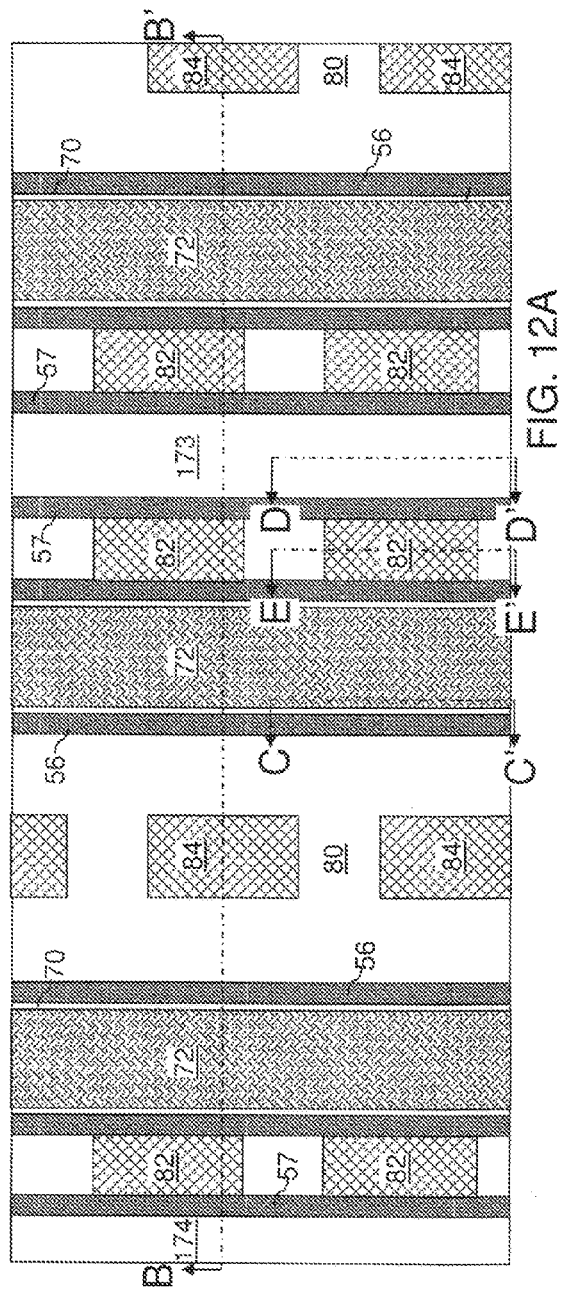
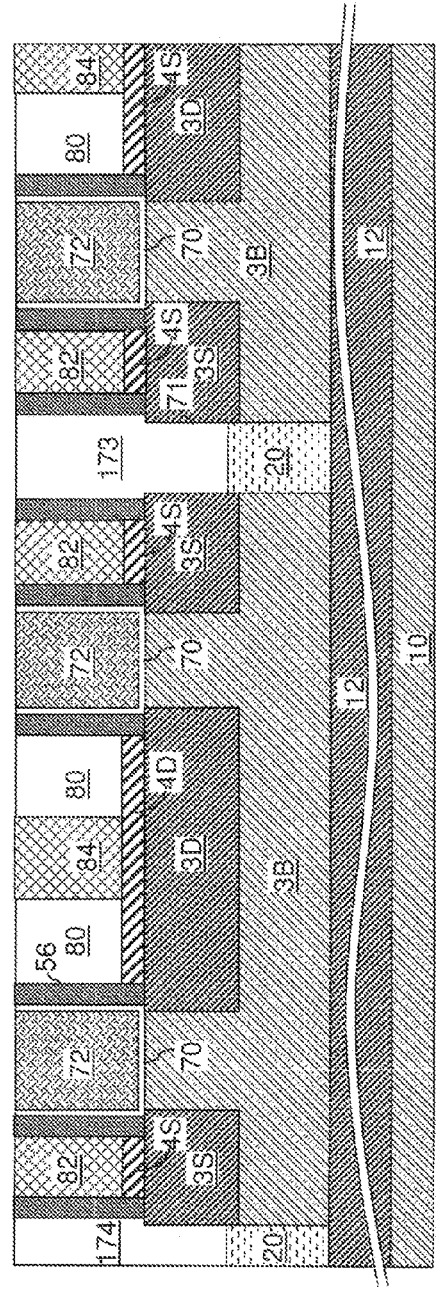
FIG. 12A
FIG. 12B

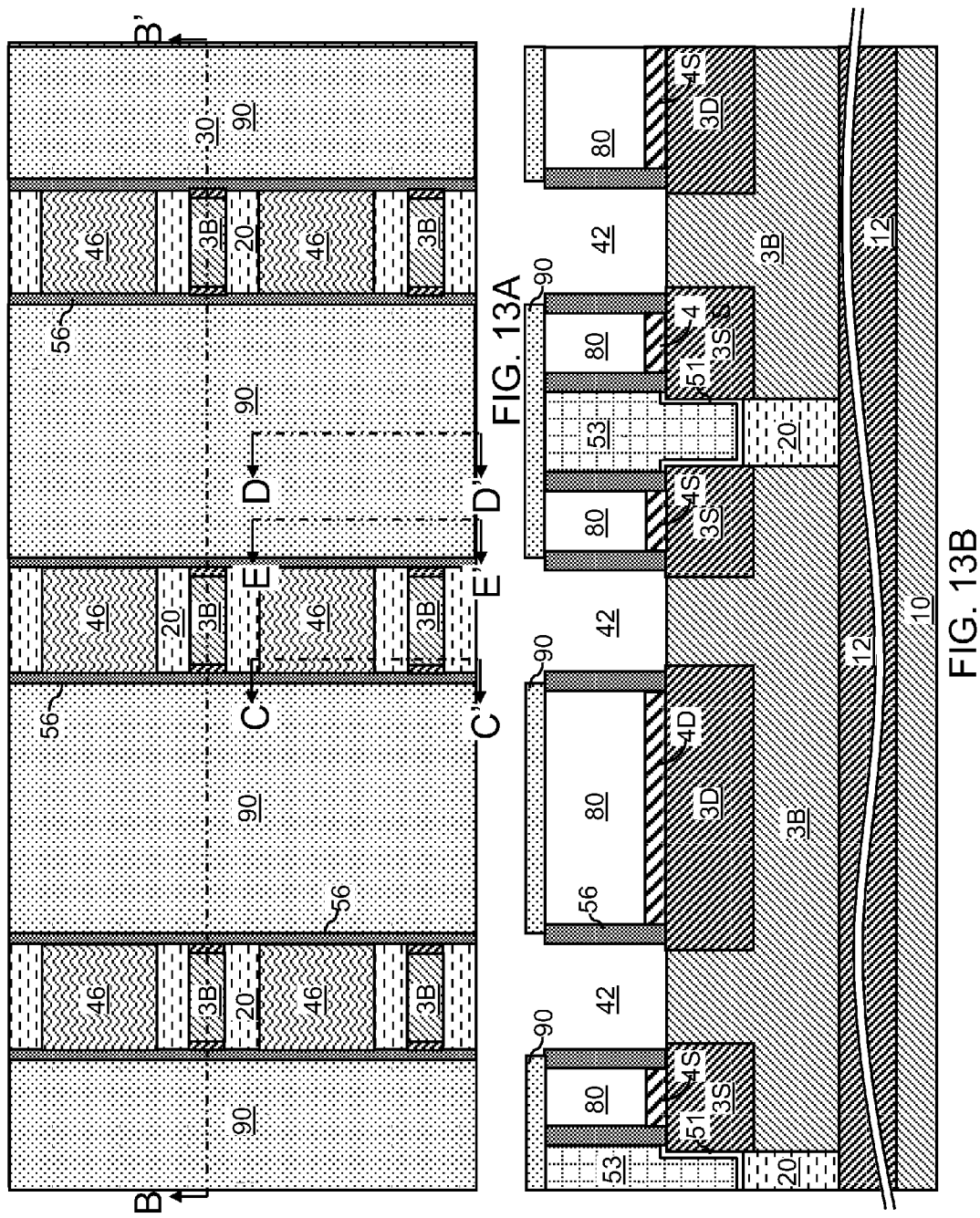

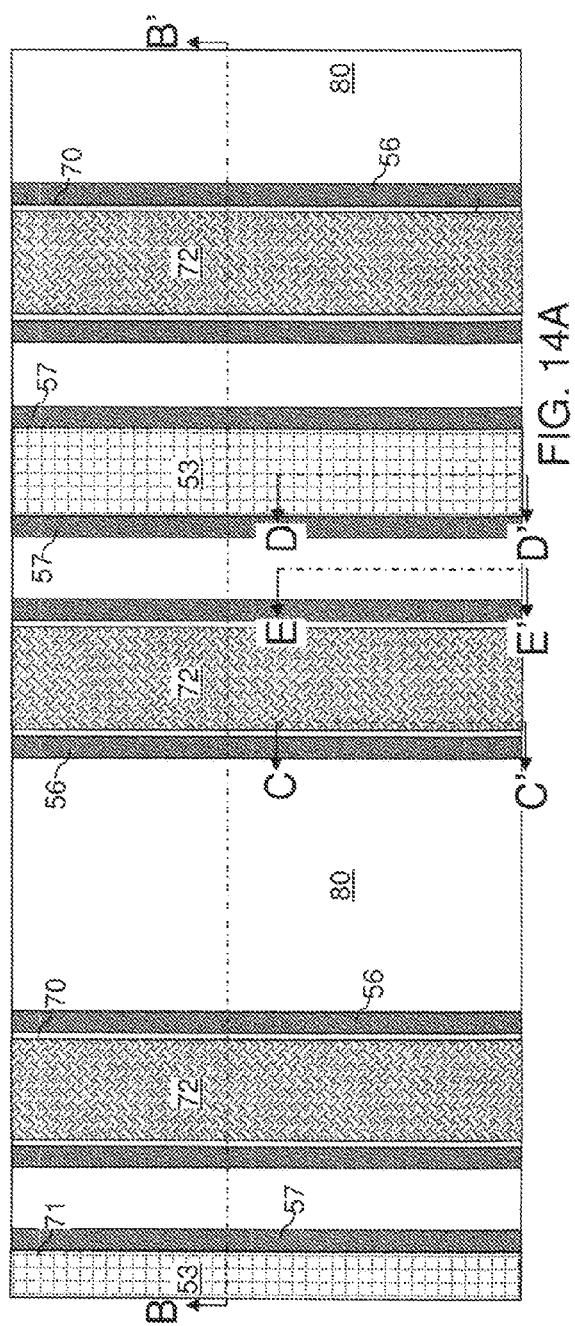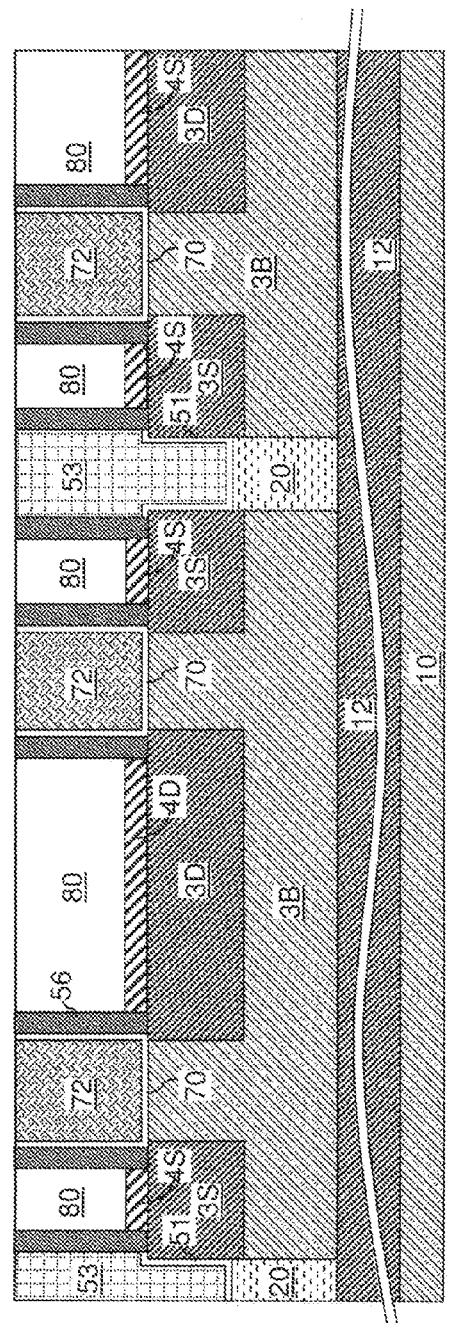
FIG. 14A
FIG. 14B

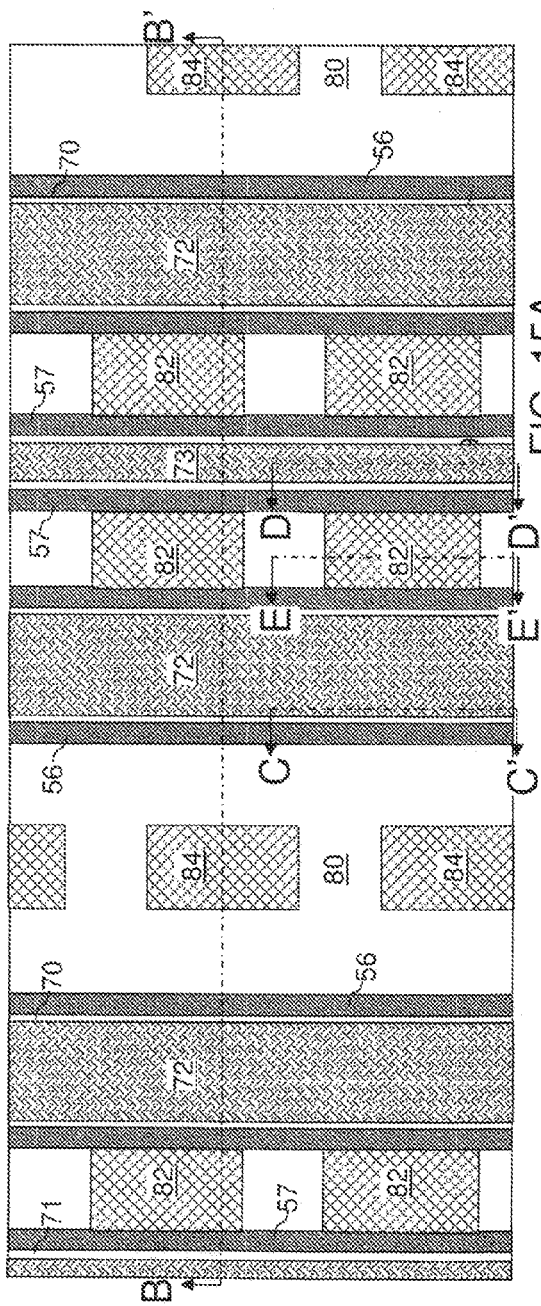
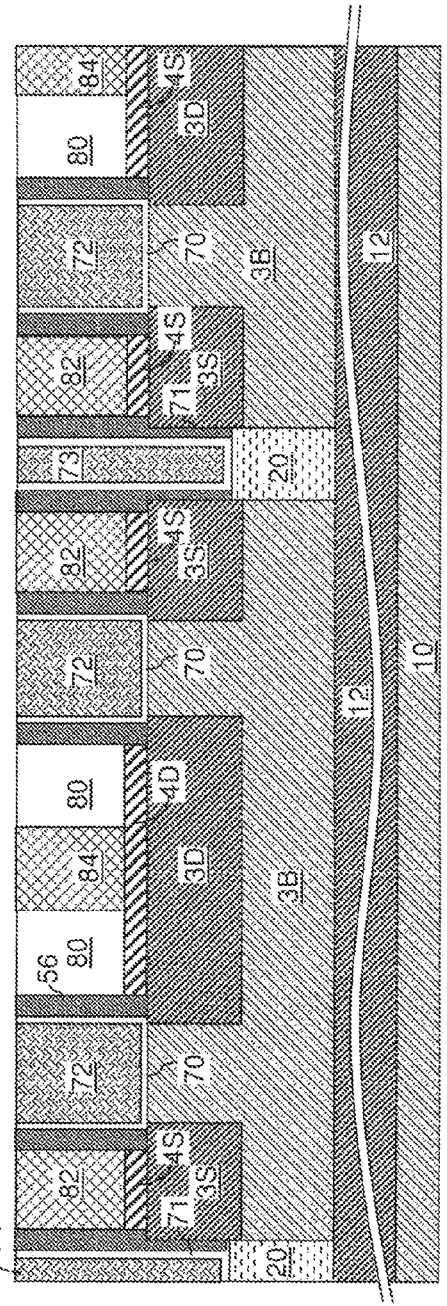
FIG. 15A
FIG. 15B

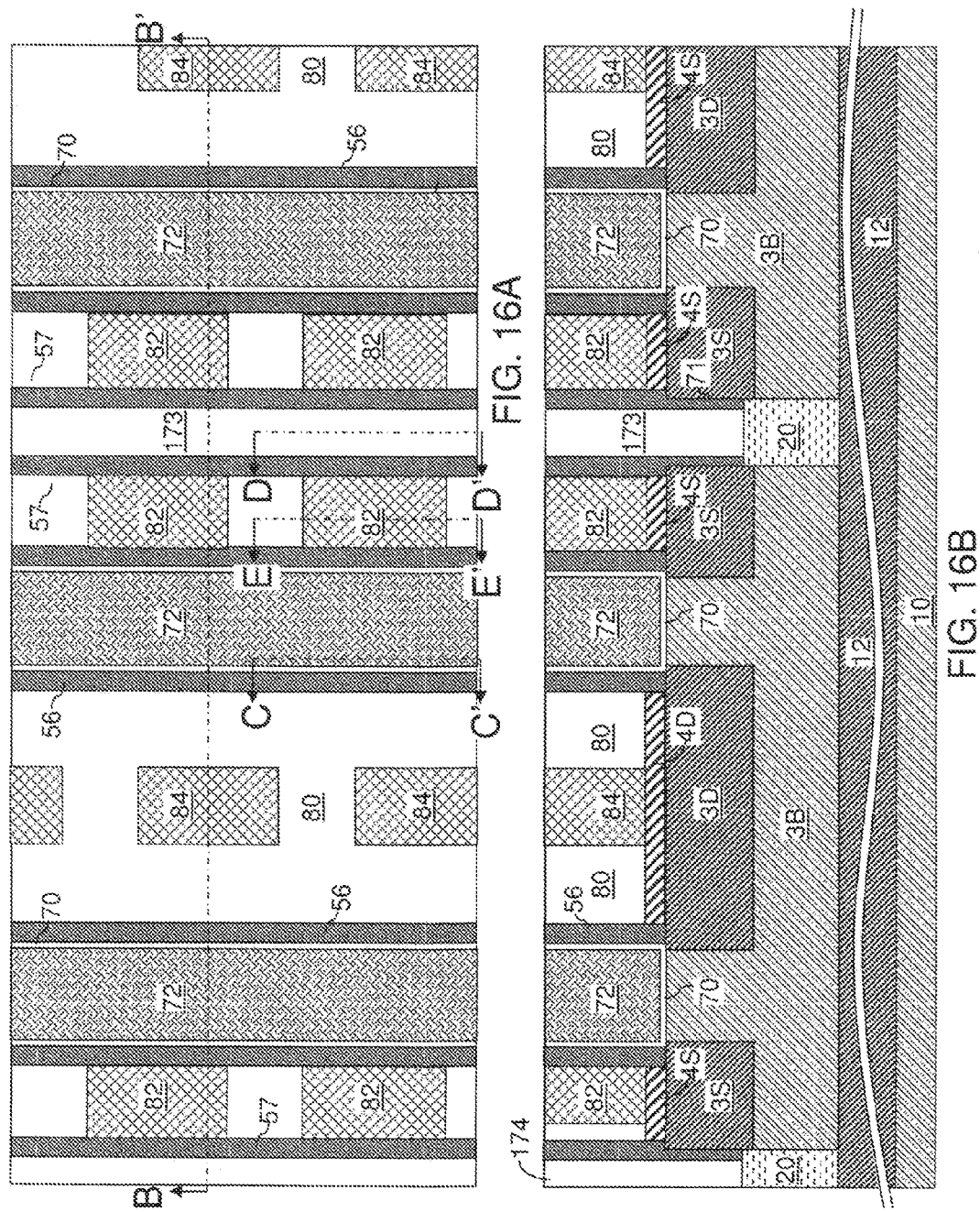

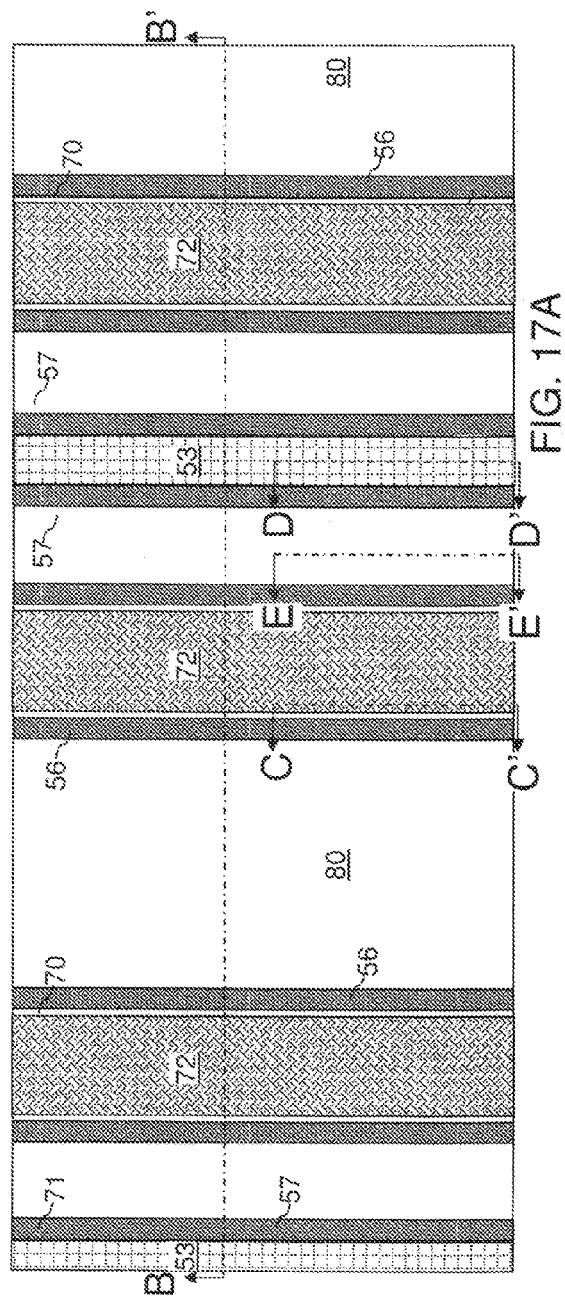
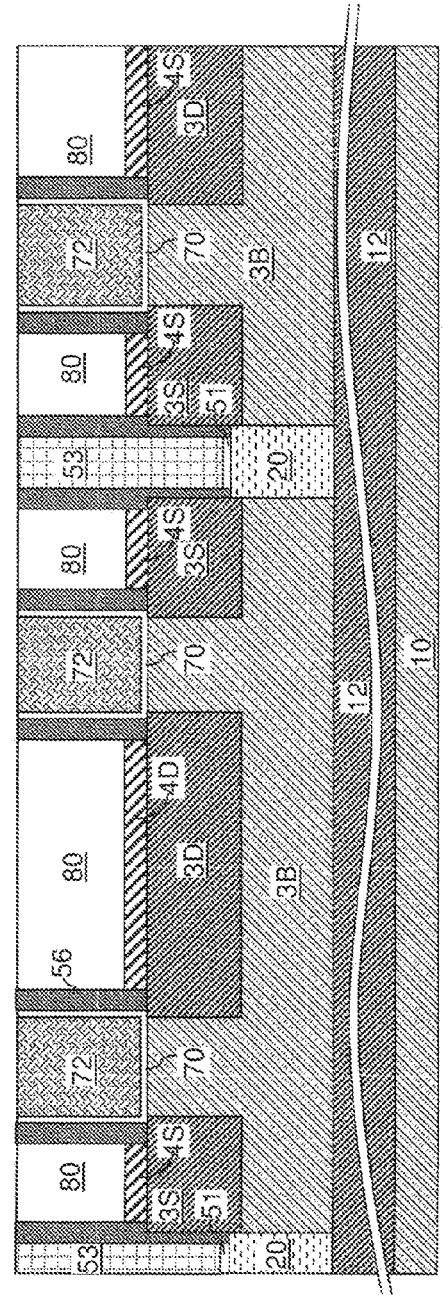
FIG. 17A
FIG. 17B

DUMMY GATE STRUCTURE FOR ELECTRICAL ISOLATION OF A FIN DRAM

BACKGROUND

The present disclosure relates to a semiconductor structure, and particularly to a dynamic random access memory (DRAM) cell including a finFET access transistor and a method of manufacturing the same.

Trench capacitors are used in a variety of semiconductor chips for high areal capacitance and low device leakage. Typically, a trench capacitor provides a capacitance in the range from 4 fF (femto-Farad) to 120 fF. A trench capacitor may be employed as a charge storage unit in a dynamic random access memory (DRAM), which may be provided as a stand-alone semiconductor chip, or may be embedded in a system-on-chip (SoC) semiconductor chip. A trench capacitor may also be employed in a variety of circuit applications such as a charge pump or a capacitive analog component in a radio-frequency (RF) circuit.

Fin dynamic random access memory devices are typically formed in a high-density array configuration in order to increase the areal density of the memory device. As the dimensions of semiconductor fins and capacitors in a fin dynamic random access memory devices, the probability of electrical shorts increases between a neighboring pair of raised source and drain regions that formed by selective epitaxy of a semiconductor material.

SUMMARY

Trench capacitors can be formed between lengthwise sidewalls of semiconductor fins, and source and drain regions of access transistors are formed in the semiconductor fins. A dummy gate structure is formed between end walls of a neighboring pair of semiconductor fins, and limits the lateral extent of raised source and drain regions that are formed by selective epitaxy. The dummy gate structure prevents electrical shorts between neighboring semiconductor fins. Gate spacers can be formed around gate structures and the dummy gate structures. The dummy gate structures can be replaced with dummy replacement gate structures or dielectric material portions, or can remain the same without substitution of any material. The dummy gate structures may consist of at least one dielectric material, or may include electrically floating conductive material portions.

According to an aspect of the present disclosure, a semiconductor structure includes semiconductor fins located on a substrate. Each of the semiconductor fins is laterally bound by a pair of lengthwise sidewalls and a pair of widthwise sidewalls. The semiconductor structure further includes trench capacitors located within the substrate. An inner electrode of each trench capacitor is electrically shorted to a source region in one of the semiconductor fins. A gate structure straddles one of the semiconductor fins. The gate structure includes a stack of a gate dielectric and a gate electrode and a gate spacer laterally surrounding the gate dielectric and the gate electrode. A dummy gate structure including dielectric surfaces is located between a widthwise sidewall of one of the semiconductor fins and a widthwise sidewall of another of the semiconductor fins and laterally extending along a same direction as the gate structure.

According to another aspect of the present disclosure, a method of forming a semiconductor structure is provided. Semiconductor fins are formed on a substrate. Each of the semiconductor fins is laterally bound by a pair of lengthwise sidewalls and a pair of widthwise sidewalls. Trench capacitors are formed within the substrate. A gate structure straddling one of the semiconductor fins is formed. The gate structure includes a gate dielectric and a gate electrode contacting the gate dielectric. A dummy gate structure is formed between two of the semiconductor fins. The dummy gate structure laterally extends along a same direction as the gate structure.

BRIEF DESCRIPTION OF SEVERAL VIEWS OF THE DRAWINGS

FIG. 1A is a top-down view of a first exemplary semiconductor structure after formation of semiconductor fins in a semiconductor substrate according to a first embodiment of the present disclosure.

FIG. 1B is a vertical cross-sectional view of the first exemplary semiconductor structure along the vertical plane B-B' in FIG. 1A.

FIG. 1C is a vertical cross-sectional view of the first exemplary semiconductor structure along the vertical plane C-C' in FIG. 1A.

FIG. 1D is a vertical cross-sectional view of the first exemplary semiconductor structure along the vertical plane D-D' in FIG. 1A.

FIG. 2A is a top-down view of a first exemplary semiconductor structure after formation of a shallow trench isolation layer according to the first embodiment of the present disclosure.

FIG. 2B is a vertical cross-sectional view of the first exemplary semiconductor structure along the vertical plane B-B' in FIG. 2A.

FIG. 3A is a top-down view of a first exemplary semiconductor structure after formation of trenches according to the first embodiment of the present disclosure.

FIG. 3B is a vertical cross-sectional view of the first exemplary semiconductor structure along the vertical plane B-B' in FIG. 3A.

FIG. 4A is a top-down view of a first exemplary semiconductor structure after formation of node dielectrics and inner electrodes according to the first embodiment of the present disclosure.

FIG. 4B is a vertical cross-sectional view of the first exemplary semiconductor structure along the vertical plane B-B' in FIG. 4A.

FIG. 5A is a top-down view of a first exemplary semiconductor structure after formation of trench top dielectric portions according to the first embodiment of the present disclosure.

FIG. 5B is a vertical cross-sectional view of the first exemplary semiconductor structure along the vertical plane B-B' in FIG. 5A.

FIG. 6A is a top-down view of a first exemplary semiconductor structure after recessing the shallow trench isolation layer and the trench top dielectric portions according to the first embodiment of the present disclosure.

FIG. 6B is a vertical cross-sectional view of the first exemplary semiconductor structure along the vertical plane B-B' in FIG. 6A.

FIG. 8A is a top-down view of a first exemplary semiconductor structure after formation of gate spacers and raised source and drain regions according to the first embodiment of the present disclosure.

FIG. 8B is a vertical cross-sectional view of the first exemplary semiconductor structure along the vertical plane B-B' in FIG. 8A.

FIG. 9A is a top-down view of a first exemplary semiconductor structure after formation of a planarization dielectric layer according to the first embodiment of the present disclosure.

FIG. 9B is a vertical cross-sectional view of the first exemplary semiconductor structure along the vertical plane B-B' in FIG. 9A.

FIG. 10A is a top-down view of a first exemplary semiconductor structure after formation of replacement gate structures and dummy replacement gate structures according to the first embodiment of the present disclosure.

FIG. 10B is a vertical cross-sectional view of the first exemplary semiconductor structure along the vertical plane B-B' in FIG. 10A.

FIG. 11A is a top-down view of a first exemplary semiconductor structure after formation of various conductive structures according to the first embodiment of the present disclosure.

FIG. 11B is a vertical cross-sectional view of the first exemplary semiconductor structure along the vertical plane B-B' in FIG. 11A.

FIG. 12A is a top-down view of a second exemplary semiconductor structure in which dummy gate structures are replaced with dielectric dummy gate structures according to a second embodiment of the present disclosure.

FIG. 12B is a vertical cross-sectional view of the second exemplary semiconductor structure along the vertical plane B-B' in FIG. 12A.

FIG. 13A is a top-down view of a third exemplary semiconductor structure after masking dummy gate structures and removal of disposable gate structures according to a third embodiment of the present disclosure.

FIG. 13B is a vertical cross-sectional view of the third exemplary semiconductor structure along the vertical plane B-B' in FIG. 13A.

FIG. 14A is a top-down view of a fourth exemplary semiconductor structure after formation of replacement gate structures according to a fourth embodiment of the present disclosure.

FIG. 14B is a vertical cross-sectional view of the fourth exemplary semiconductor structure along the vertical plane B-B' in FIG. 14A.

FIG. 15A is a top-down view of a variation of the first exemplary semiconductor structure according to the first embodiment of the present disclosure.

FIG. 15B is a vertical cross-sectional view of the variation of the first exemplary semiconductor structure along the vertical plane B-B' in FIG. 15A.

FIG. 16A is a top-down view of a variation of the second exemplary semiconductor structure according to the first embodiment of the present disclosure.

FIG. 16B is a vertical cross-sectional view of the variation of the second exemplary semiconductor structure along the vertical plane B-B' in FIG. 16A.

FIG. 17A is a top-down view of a variation of the third exemplary semiconductor structure according to the first embodiment of the present disclosure.

FIG. 17B is a vertical cross-sectional view of the variation of the third exemplary semiconductor structure along the vertical plane B-B' in FIG. 16A.

DETAILED DESCRIPTION

Figure 2D:
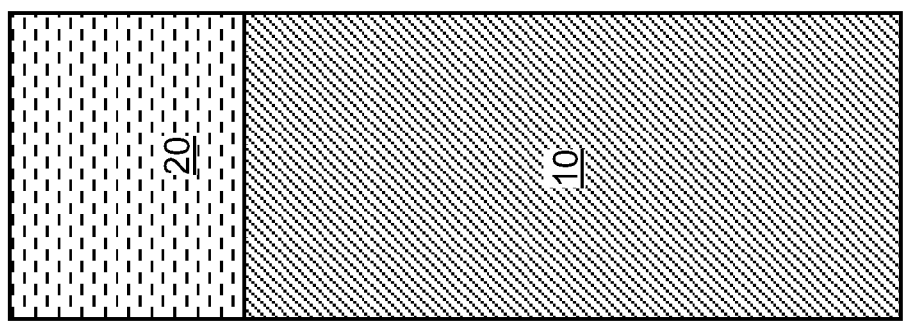
FIG. 2D is a vertical cross-sectional view of the first exemplary semiconductor structure along the vertical plane D-D' in FIG. 2A.

As stated above, the present disclosure relates to a dynamic random access memory (DRAM) cell including a finFET access transistor and a method of manufacturing the same. These aspects of the present disclosure are now described in detail with accompanying figures. It is noted that like reference numerals refer to like elements across different embodiments. The drawings are not necessarily drawn to scale.

Referring to FIGS. 1A-1D, a first exemplary semiconductor structure according to a first embodiment of the present disclosure includes a semiconductor substrate, which can be a bulk semiconductor substrate. The semiconductor substrate includes a semiconductor material, which can be selected from elemental semiconductor materials (e.g., silicon, germanium, carbon, or alloys thereof), III-V semiconductor materials, or II-VI semiconductor materials. In one embodiment, the semiconductor substrate can include a single crystalline semiconductor material.

An upper portion of the semiconductor substrate can be patterned, by a combination of lithographic methods and an anisotropic etch, to form a plurality of semiconductor fins 30. The height of the semiconductor fins 30 can be from 5 nm to 300 nm, although lesser and greater heights can also be employed. The remaining portion of the semiconductor substrate underlying the plurality of semiconductor fins 30 is herein referred to as a semiconductor material layer 10. The plurality of semiconductor fins 30 and the semiconductor material layer 10 can be doped with electrical dopants, i.e., p-type dopants or n-type dopants, or can be intrinsic. In one embodiment, the entirety of the plurality of semiconductor fins 30 and the semiconductor material layer 10 can have a same type of doping, which is herein referred to as a first conductivity type.

As used herein, a "semiconductor fin" refers to a semiconductor material portion having a pair of parallel vertical sidewalls that are laterally spaced by a uniform dimension. In one embodiment, each semiconductor fin can have a rectangular horizontal cross-sectional area such that the spacing between the pair of parallel vertical sidewalls is the same as the length of shorter sides of the shape of the rectangular horizontal cross-sectional area. As used herein, a "fin field effect transistor" refers to a field effect transistor in which at least a channel region is located within a semiconductor fin.

Each semiconductor fin 30 is laterally bound by a pair of lengthwise sidewalls and a pair of widthwise sidewalls. As used herein, a "lengthwise direction" of an element refers to a direction about which the moment of inertia of the element becomes a minimum. As used herein, a "lengthwise sidewall" of an element refers to a sidewall of an element that extends along the lengthwise direction of the element. As used herein, a "widthwise sidewall" of an element refers to a sidewall of the element that extends along a horizontal direction that is perpendicular to the lengthwise direction of the element. In one embodiment, each of the plurality of semiconductor fins 30 can have a rectangular horizontal cross-sectional shape.

In one embodiment, lengthwise sidewalls of multiple semiconductor fins 30 within a same row can be within a pair of vertical planes laterally spaced from each other by the width of a semiconductor fin 30. In one embodiment, widthwise sidewalls of multiple semiconductors within a same column can be within a pair of vertical planes laterally spaced from each other by the length of a semiconductor fin 30. In one embodiment, the plurality of semiconductor fins 30 can be within a two-dimensional array having a first pitch along the lengthwise direction of the semiconductor fins 30 and a second pitch along the lengthwise direction of the semiconductor fins.

Figure 2C:
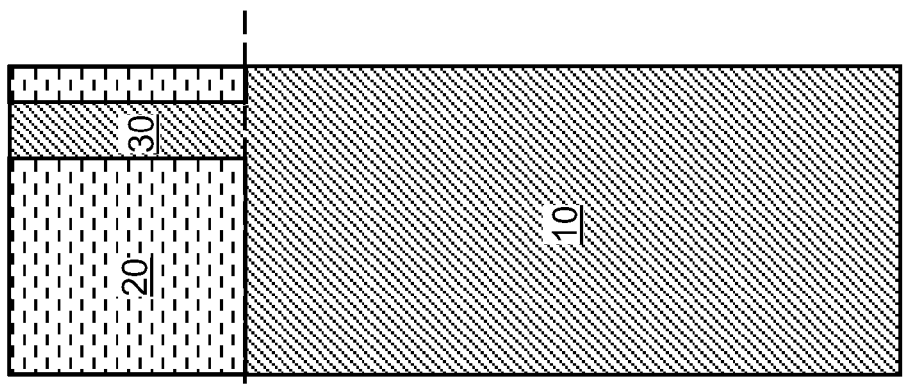
FIG. 2C is a vertical cross-sectional view of the first exemplary semiconductor structure along the vertical plane C-C' in FIG. 2A.

Referring to FIGS. 2A-2D, a shallow trench isolation layer 20 is formed among the plurality of semiconductor fins 30. The shallow trench isolation layer 20 includes a dielectric material such as silicon oxide. The shallow trench isolation layer 20 can be formed by depositing a dielectric material over the semiconductor fins 30 and the semiconductor material layer 10. The deposition of the dielectric material can be performed, for example, by chemical vapor deposition or spin coating. Excess portions of the deposited dielectric material can be removed from above the top surfaces of the semiconductor fins 30, for example, by planarization (such as chemical mechanical planarization (CMP)). The shallow trench isolation layer 30 laterally surrounds the plurality of semiconductor fins 30. The top surface of the shallow trench isolation layer 30 can be coplanar with the top surfaces of the plurality of semiconductor fins 30.

Figure 3C:
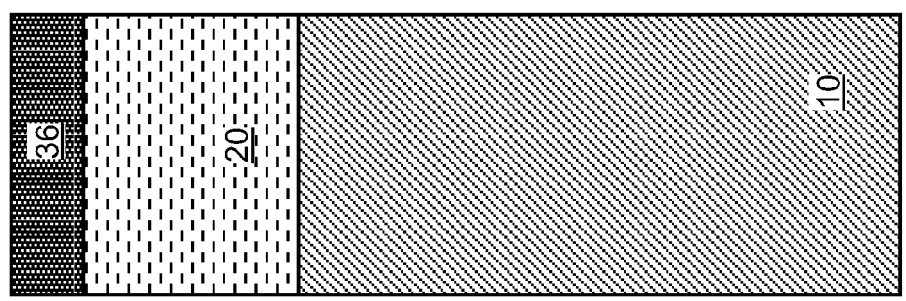
FIG. 3C is a vertical cross-sectional view of the first exemplary semiconductor structure along the vertical plane C-C' in FIG. 3A.
Figure 3D:
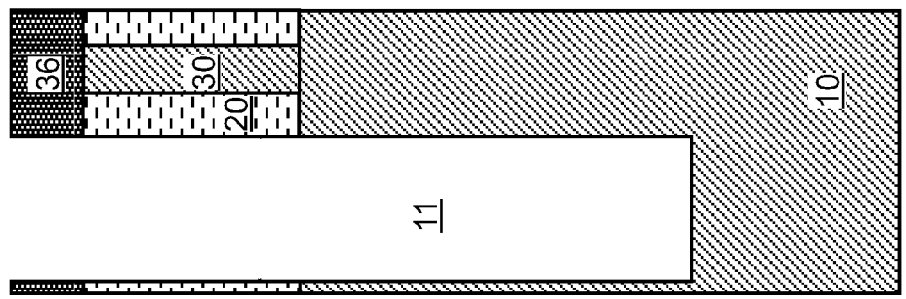
FIG. 3D is a vertical cross-sectional view of the first exemplary semiconductor structure along the vertical plane D-D' in FIG. 3A.

Referring to FIGS. 3A-3D, a hard mask layer 36 can be deposited over the shallow trench isolation layer 20, for example, by chemical vapor deposition (CVD). The hard mask layer 36 can include one or more layers that can be employed as an etch mask for forming trenches 11 in the semiconductor material layer 10. In one embodiment, the hard mask layer 36 can include a dielectric material such as a doped or undoped silicon oxide, silicon nitride, a dielectric metal nitride, or a dielectric metal oxide. The thickness of the hard mask layer 36 can be from 100 nm to 2,000 nm, although lesser and greater thicknesses can also be employed.

A photoresist layer (not shown) can be applied over the hard mask layer 36, and can be lithographically patterned to form openings corresponding to the areas of trenches 11 to be subsequently formed. The pattern in the photoresist layer can be transferred into the hard mask layer 36. Subsequently, the pattern in the hard mask layer 36 can be transferred through the shallow trench isolation layer 20 and an upper portion of the semiconductor material layer 10 by an anisotropic etch that employs the hard mask layer 36 as an etch mask. A trench 11 can be formed for each opening in the hard mask layer 36. The photoresist can be removed by ashing, or can be consumed during the etch process that forms the trenches 11.

In one embodiment, the locations of the openings in the photoresist layer and the hard mask layer 36 can be selected such that entire periphery of each trench 11 can be formed between a first vertical plane including a proximal lengthwise sidewall of a first semiconductor fin 30 within a neighboring pair of the semiconductor fins 30 and a second vertical plane including a proximal lengthwise sidewall of a second semiconductor fin within the neighboring pair of the semiconductor fins 30. Within the neighboring pair of the semiconductor fins 30, the first semiconductor fin and the second semiconductor fin are laterally spaced from each other by the widthwise direction of the semiconductor fins 30, i.e., along the horizontal direction perpendicular to the lengthwise direction of each semiconductor fin 30. Further, the entire periphery of each trench 11 can be formed between a pair of vertical planes including two widthwise sidewalls of the first semiconductor fin, which can also include two widthwise sidewalls of the second semiconductor fin.

The sidewalls of each trench 11 can be substantially vertically coincident among the various layers (36, 20, 10) through which the trench 11 extends. As used herein, sidewalls of multiple elements are "vertically coincident" if the sidewalls of the multiple elements overlap in a top-down view. As used herein, sidewalls of multiple elements are "substantially vertically coincident" if the lateral offset of the sidewalls of the multiple elements from a perfectly vertical surface is within three times the root mean square of surface roughness of sidewalls of each element.

The depth of each trench 11 as measured from the plane of the topmost surface of the semiconductor fins 30 to the bottom surface of the trench 11 can be from 500 nm to 10 microns, although lesser and greater depths can also be employed. In one embodiment, the trenches 11 can be deep trenches. As used herein, a "deep trench" refers to a trench that having a depth greater than 2.0 microns. The lateral dimensions of each trench 11 can be limited by the lithographic capabilities, i.e., the ability of a lithographic tool to print the image of an opening on the photoresist layer.

Figure 4C:
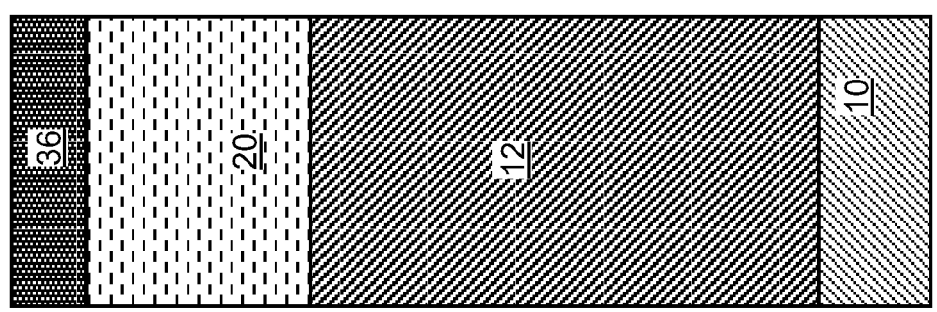
FIG. 4C is a vertical cross-sectional view of the first exemplary semiconductor structure along the vertical plane C-C' in FIG. 4A.
Figure 4D:
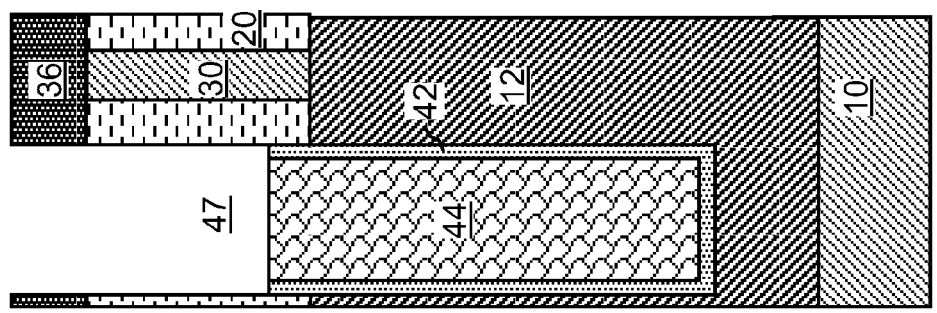
FIG. 4D is a vertical cross-sectional view of the first exemplary semiconductor structure along the vertical plane D-D' in FIG. 4A.

Referring to FIGS. 4A-4D, buried plates 12 can be formed by doping a portion of the semiconductor material layer 10 in proximity of sidewalls of each trench 11. Dopants can be introduced, for example, by outdiffusion from a dopant-including disposable material (such as a doped silicate glass) or by ion implantation as known in the art. Further, any other method of forming buried plates 12 in the semiconductor material layer 10 can be employed in lieu of outdiffusion from a dopant-including disposable material or ion implantation.

In one embodiment, the buried plates 12 can be doped with dopants of a second conductivity type, which is the opposite of the first conductivity type. For example, the first conductivity type can be p-type and the second conductivity type can be n-type, or vice versa. A p-n junction is formed between the remaining portion of the semiconductor material layer 10 and the buried plates 12. The dopant concentration in the buried plates 12 can be, for example, from $1.0 \times 10^{18}/cm^3$ to $2.0 \times 10^{21}/cm^3$, and typically from $5.0 \times 10^{18}/cm^3$ to $5.0 \times 10^{19}/cm^3$, although lesser and greater dopant concentrations can also be employed.

A node dielectric 42 can be deposited conformally on all physically exposed sidewalls in each trench 11 and on the top surface of the hard mask layer 36. The node dielectric 42 can include any dielectric material that can be employed as a node dielectric material in a capacitor known in the art. For example, the node dielectric 42 can include at least one of silicon nitride and a dielectric metal oxide material such as high dielectric constant (high-k) gate dielectric material as known in the art.

A conductive material can be deposited to completely fill each trench 11. The conductive material can be a metallic material or a doped semiconductor material. The metallic material can be an elemental metal such as W, Ti, Ta, Cu, or Al, or an alloy of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The conductive material can be deposited by physical vapor deposition (PVD), chemical vapor deposition (CVD), electroplating, electroless plating, or a combination thereof. The conductive material is deposited to a thickness that is sufficient to fill each trench 11 completely.

Excess portions of the conductive material can be removed from above the top surface of the hard mask layer 36, for example, by chemical mechanical planarization. Subsequently, the conductive material can be vertically recessed to a level between the top surface of the shallow trench isolation layer 20 and the bottom surface of the shallow trench isolation layer 20 by a recess etch. The recess etch of the conductive material layer can employ an anisotropic etch such as a reactive ion etch, an isotropic etch such as a wet etch, or a combination thereof. The recess etch can be selective to the material of the node dielectric 42.

An inner electrode 44 including the conductive material is formed in each trench 11. The topmost surface of the inner electrode 44 is substantially planar, and is located between the level of the top surface of the shallow trench isolation layer 20 and the level of the bottom surface of the shallow trench isolation layer 20. A surface is substantially planar if the planarity of the surface is limited by microscopic variations in surface height that accompanies semiconductor processing steps known in the art. A cavity 47 is formed above the inner electrode 44.

The physically exposed portions of the node dielectrics 42 can be patterned by an etch, which can be a wet etch. For example, if the node dielectrics 42 include silicon nitride, the physically exposed portions of the node dielectric 42 can be removed by a wet etch employing hot phosphoric acid. Each remaining portion of the node dielectric 42 within each trench 11 constitutes a node dielectric 42. Each adjoined set of a buried plate 12, a node dielectric 42, and an inner electrode 44 constitute a trench capacitor (12, 42, 44). Each buried plate 12 is an outer node of the trench capacitor, the node dielectric 42 is the dielectric separating the outer electrode from the inner electrode, and the inner electrode 44 is the inner electrode of the trench capacitor. The trench capacitor is embedded within the combination of the semiconductor material layer 10 and the shallow trench isolation layer 20. The shallow trench isolation layer 20 overlies the buried plate 12 (i.e., the outer electrode).

Figure 5D:
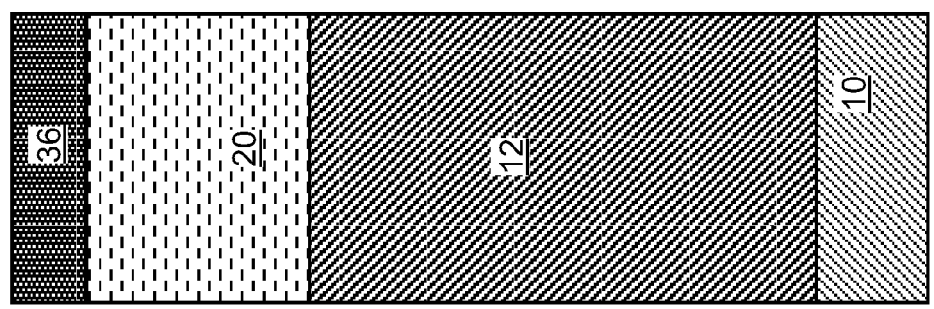
FIG. 5D is a vertical cross-sectional view of the first exemplary semiconductor structure along the vertical plane D-D' in FIG. 5A.
Figure 5C:
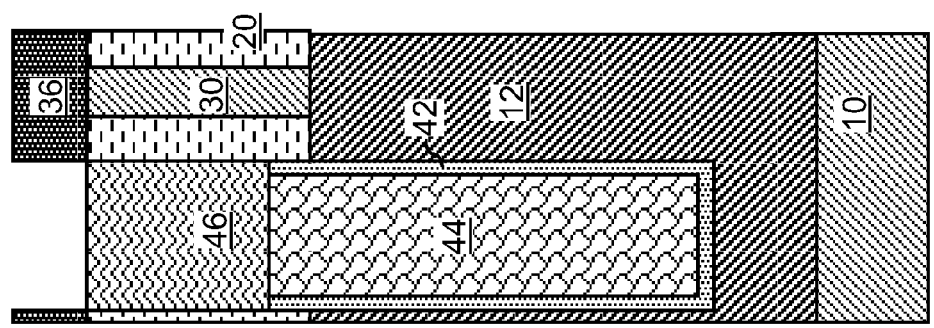
FIG. 5C is a vertical cross-sectional view of the first exemplary semiconductor structure along the vertical plane C-C' in FIG. 5A.

Referring to FIGS. 5A-5D, a dielectric material can be deposited within the cavity 47, and can be subsequently planarized employing the hard mask layer 36 as a stopping layer to remove excess portions of the deposited dielectric material from above the top surface of the hard mask layer 36. The remaining portion of the deposited dielectric material can be recessed relative to the top surface of the hard mask layer 36 by a recess etch to a height about the top surface of the shallow trench isolation layer 20 to form a trench top dielectric portion 46 within each trench. The dielectric material of the trench top dielectric portions 46 can be different from the dielectric material of the hard mask layer 36. For example, the dielectric material of the hard mask layer 36 can be silicon nitride, and dielectric material of the trench top dielectric portion 46 can be silicon oxide. The dielectric material of the trench top dielectric portion 46 can be deposited, for example, by chemical vapor deposition (CVD).

Figure 6D:
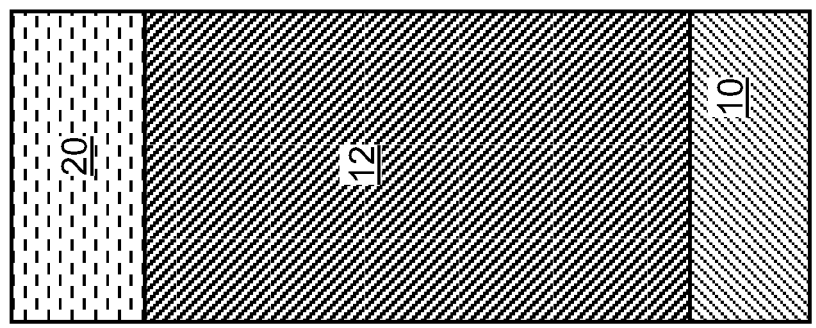
FIG. 6D is a vertical cross-sectional view of the first exemplary semiconductor structure along the vertical plane D-D' in FIG. 6A.
Figure 6C:
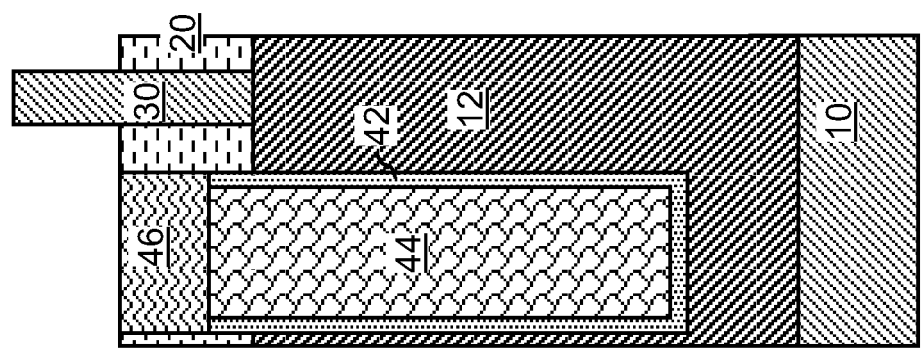
FIG. 6C is a vertical cross-sectional view of the first exemplary semiconductor structure along the vertical plane C-C' in FIG. 6A.

Referring to FIGS. 6A-6D, the hard mask layer 36 can be removed, for example, by a wet etch selective to the trench top dielectric portion 46 and the shallow trench isolation layer 20. In one embodiment, the hard mask layer 36 can include silicon nitride, the trench top dielectric portion 46 and the shallow trench isolation layer 20 include silicon oxide, and the removal of the hard mask layer 36 selective to the trench top dielectric portion 46 and the shallow trench isolation layer 20 can be effected by a wet etch employing hot phosphoric acid.

The shallow trench isolation layer 20 and the trench top dielectric portions 46 are recessed relative to the top surfaces of the semiconductor fins 30. An etch process that is selective to the semiconductor material of the semiconductor fins 30 can be employed to recess the shallow trench isolation layer 20 and the trench top dielectric portions 46. For example, if the shallow trench isolation layer 20 and the trench top dielectric portion 46 include silicon oxide, a wet etch employing hydrofluoric acid can be employed to recess the shallow trench isolation layer 20 and the trench top dielectric portions 46. Surfaces of an upper portion of each semiconductor fin 30 are physically exposed.

Figures 7A, 7B:
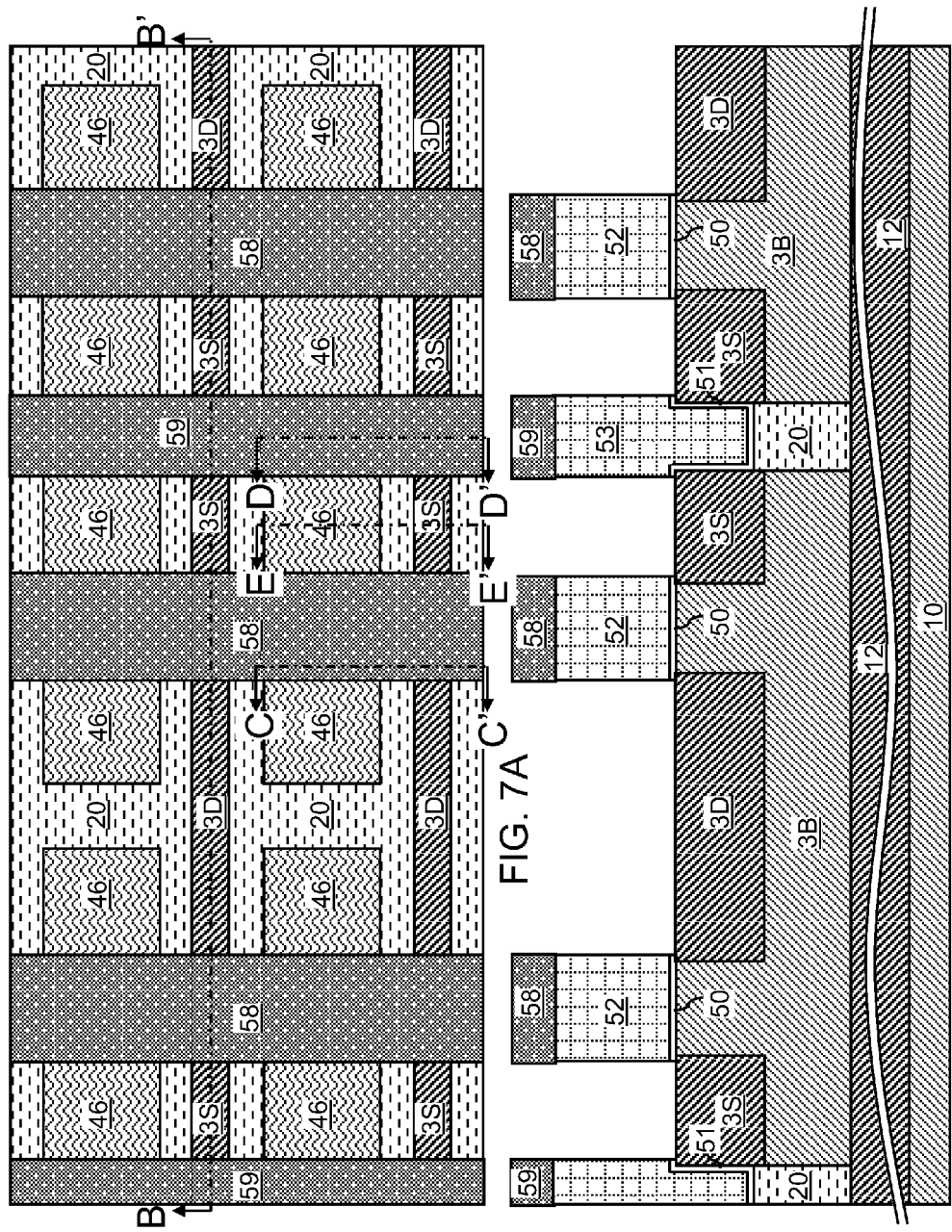
FIG. 7A is a top-down view of a first exemplary semiconductor structure after formation of disposable gate structures and dummy gate structures according to the first embodiment of the present disclosure.
FIG. 7B is a vertical cross-sectional view of the first exemplary semiconductor structure along the vertical plane B-B' in FIG. 7A.
Figure 7E:
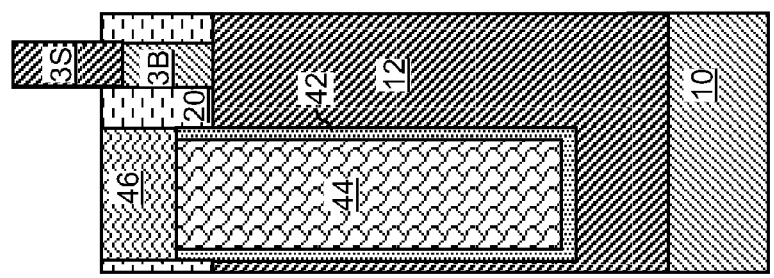
FIG. 7E is a vertical cross-sectional view of the first exemplary semiconductor structure along the vertical plane E-E' in FIG. 7A.
Figure 7D:
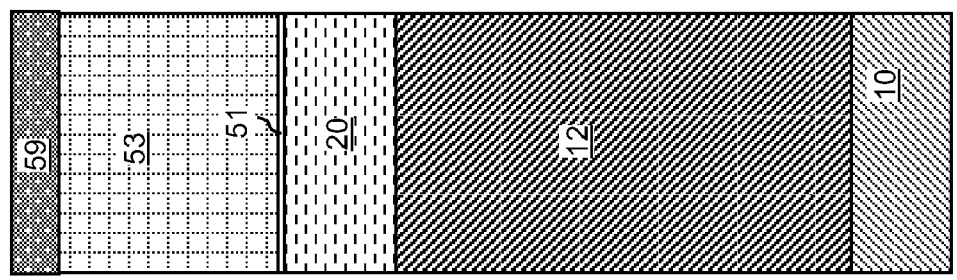
FIG. 7D is a vertical cross-sectional view of the first exemplary semiconductor structure along the vertical plane D-D' in FIG. 7A.
Figure 7C:
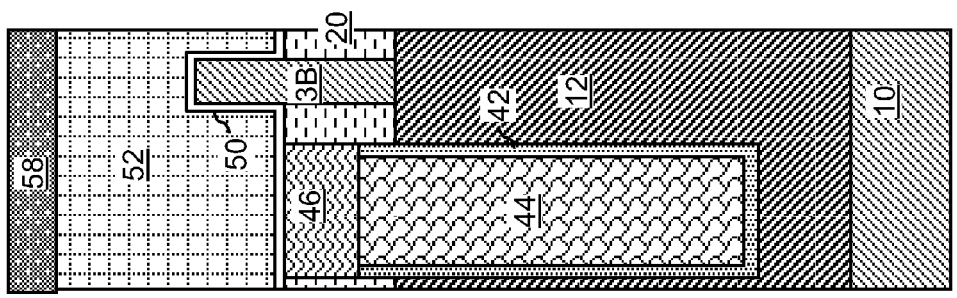
FIG. 7C is a vertical cross-sectional view of the first exemplary semiconductor structure along the vertical plane C-C' in FIG. 7A.

Referring to FIGS. 7A-7E, a stack of gate level layers can be deposited and lithographically patterned to form various gate-level structures. As used herein, a "gate-level structure" refers to a structure that is formed at the same level as gate electrodes of field effect transistors. As such, a gate-level structure includes a surface that contacts a semiconductor fin and/or the shallow trench isolation layer 20.

The gate level layers can include, for example, a gate dielectric layer, a gate material layer, and a gate cap layer. The gate dielectric layer can be a disposable dielectric material that is removed in field effect transistors to be formed, or can include a non-disposable dielectric material that remains permanently in field effect transistors to be formed. The gate material layer can include a disposable material that is removed in field effect transistors to be formed, or can include a non-disposable conductive material that remains permanently in field effect transistors to be formed. The gate cap layer includes a dielectric material such as silicon nitride or a dielectric nitride.

The gate dielectric layer can be formed by conversion of surface portions of a semiconductor material (e.g., the semiconductor material of the semiconductor fins 30; See FIGS. 6A-6D), deposition of a dielectric material, or a combination thereof. The gate dielectric layer can include a dielectric semiconductor-containing compound (e.g., silicon oxide, silicon nitride, and/or silicon oxynitride) and/or a dielectric metal compound (e.g., dielectric metal oxide, dielectric metal nitride, and/or dielectric metal oxynitride).

If the gate fill layer includes a non-disposable conductive material, the gate material layer can include a doped semiconductor material and/or a metallic material. The gate fill layer can optionally include a work function metal layer that tunes the threshold voltage of the access transistor to be formed.

The gate level layers can be patterned by a combination of lithography and etch to form various gate-level structures. The gate-level structures include gate structures (50, 52, 58) that straddle semiconductor fins 30 without contacting widthwise sidewalls of the semiconductor fins 30, and dummy gate structures that contact widthwise sidewalls of the semiconductor fins 30 or passes through a space between a neighboring pair of widthwise sidewalls of semiconductor fins 30. As used herein, a "gate structure" refers to a gate-level structure that straddles and contacts a body region of at least one field effect transistor. As used herein, a "dummy gate structure" refers to a gate-level structure that does not straddle a body region of any field effect transistor.

Each remaining portion of the gate dielectric layer within a gate structure (50, 52, 58) constitutes a gate dielectric 50, and each remaining portion of the gate dielectric layer within a dummy gate structure (51, 53, 59) constitutes a dummy gate dielectric 51. Each remaining portion of the gate fill layer within a gate structure (50, 52, 58) constitutes a gate fill structure 52, and each remaining portion of the gate fill layer within a dummy gate structure (51, 53, 59) constitutes a dummy gate fill structure 53. Each remaining portion of the gate cap layer within a gate structure (50, 52, 58) constitutes a gate cap dielectric 58, and each remaining portion of the gate cap layer within a dummy gate structure (51, 53, 59) constitutes a dummy gate cap 59. In one embodiment, the entirety of the widthwise sidewalls of the semiconductor fins 30 can be in contact with a surface of a dummy gate dielectric 50.

Portions of the semiconductor fins 30 that underlie the gate structures (50, 52, 58) correspond to the body regions of access field effect transistors to be subsequently formed for the trench capacitors (12, 42, 44). The gate structures (50, 52, 58) and the dummy gate structures (51, 53, 59) can extend along the general direction of the widthwise direction of the plurality of semiconductor fins 30. The dummy gate structures (51, 53, 59) are formed between pairs of neighboring semiconductor fins 30 that are positioned along the lengthwise direction of the semiconductor fins 30 with respect to each other. The dummy gate structures (51, 53, 59) are formed concurrently with formation of the gate structures (50, 52, 58). While the present disclosure is described employing gate structures (50, 52, 58) and the dummy gate structures (51, 53, 59) extending along the direction perpendicular to the lengthwise direction of the semiconductor fins 30, embodiments in which wiggles are introduced within the gate structures (50, 52, 58) and the dummy gate structures (51, 53, 59) are expressly contemplated herein.

In one embodiment, the gate structures (50, 52, 58) are disposable gate structures that are subsequently replaced with other gate structures, which are herein referred to as replacement gate structures. In this case, the disposable gate structures include disposable materials, which are herein referred to as disposable gate materials, i.e., disposable materials formed within gate-level structures.

In one embodiment, the gate structures (50, 52, 58) are permanent gate structures that are present in field effect transistors and function as a combination of a gate dielectric and a gate electrode. In this case, the gate dielectric can include any gate dielectric material that can be employed in gate-first integration schemes, i.e., non-replacement gate integration schemes. Each gate fill structure 52 includes a conductive material, and constitutes a gate electrode that is functional, i.e., capable of turning on or off field effect transistors. In this case, the dummy gate structures (51, 53, 59) may, or may not, be subsequently replaced.

In one embodiment, independent of whether the gate structures (50, 52, 58) are disposable gate structures or permanent gate structures, the dummy gate structures (51, 53, 59) can be disposable dummy gate structures that are subsequently replaced with other gate structures, which are herein referred to as replacement dummy gate structures. In this case, the disposable dummy gate structures include disposable materials, which are herein referred to as disposable gate materials, i.e., disposable materials formed within gate-level structures.

In another embodiment, independent of whether the gate structures (50, 52, 58) are disposable gate structures or permanent gate structures, the dummy gate structures (51, 53, 59) can be permanent dummy gate structures that are present in field effect transistors during operation in a semiconductor chip. In this case, the dummy gate fill structure 53 may include a conductive material or a dielectric material. In this case, the gate structures (50, 52, 58) may, or may not, be subsequently replaced.

Source regions 3S and drain regions 3D can be formed by implanting dopants of the opposite conductivity type of the first conductivity type. The gate structures (50, 52, 58) and the dummy gate structures (51, 53, 59) can be employed as mask structures during the ion implantation that forms the source regions 3S and the drain regions 3D. Unimplanted portions of the semiconductor fins 30 constitute body regions 3B.

Figure 8E:
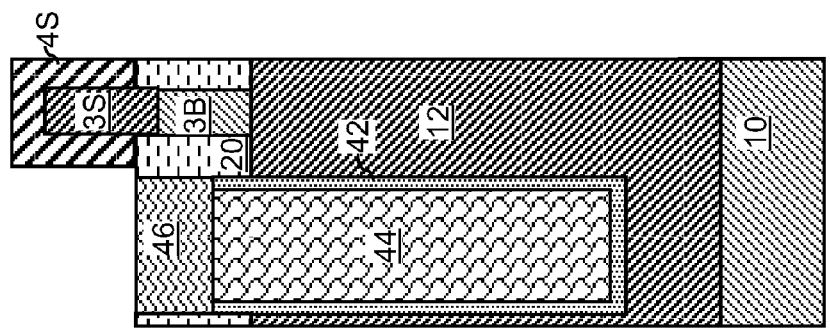
FIG. 8E is a vertical cross-sectional view of the first exemplary semiconductor structure along the vertical plane E-E' in FIG. 8A.
Figure 8D:
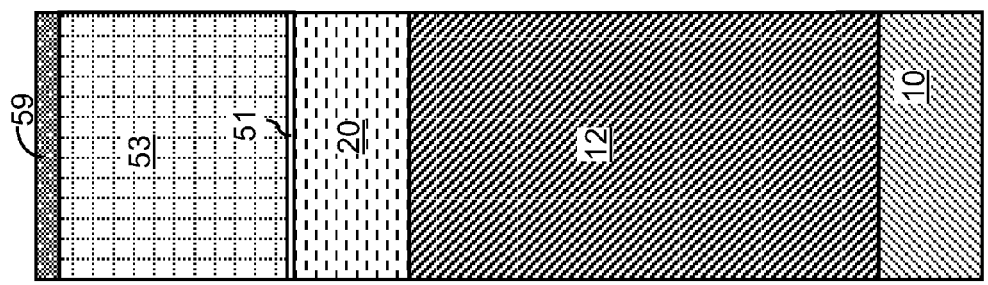
FIG. 8D is a vertical cross-sectional view of the first exemplary semiconductor structure along the vertical plane D-D' in FIG. 8A.
Figure 8C:
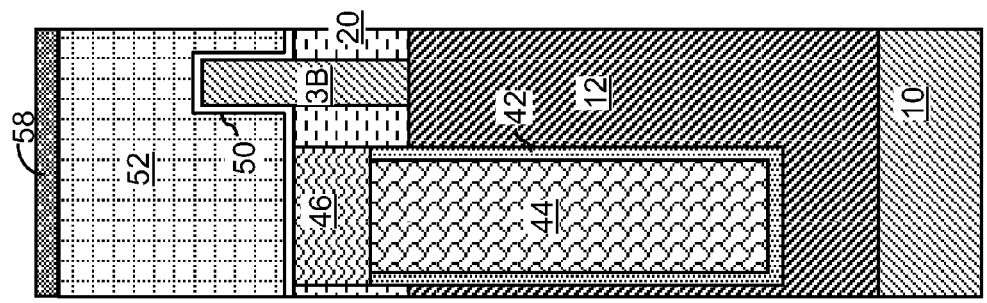
FIG. 8C is a vertical cross-sectional view of the first exemplary semiconductor structure along the vertical plane C-C' in FIG. 8A.

Referring to FIGS. 8A-8E, gate spacers 56 and dummy gate spacers 57 can be simultaneously formed by depositing a conformal dielectric layer and anisotropically etching the conformal dielectric layer. In one embodiment, the conformal dielectric layer can include a dielectric material different from the dielectric material of the shallow trench isolation layer 20. For example, the conformal dielectric layer can include silicon nitride. The etch process that removes horizontal portions of the conformal dielectric layer can be prolonged after horizontal portions of the conformal dielectric layer are removed so that vertical portions of the conformal dielectric layer on sidewalls of the semiconductor fins (3S, 3D, 3B) are removed.

Each remaining portion of the conformal dielectric layer around a gate structure (50, 52, 58) is a gate spacer 56. Each remaining portion of the conformal dielectric layer around a dummy gate structure (51, 53, 59) is a dummy gate spacer 57, i.e., a gate spacer formed on a dummy gate structure (52, 53, 59). Each gate spacer 56 laterally surrounds a gate structure (50, 52, 58), and each dummy gate spacer 57 laterally surrounds a dummy gate structure (51, 53, 59). The gate spacers 56 do not contact any widthwise sidewall of the semiconductor fins (3S, 3D, 3B), and the dummy gate spacers 57 contact end portions of the source and drain regions (3S, 3D) of the semiconductor fins.

Optionally, dopants of the second conductivity type can be implanted into the source regions 3S and the drain regions 3D of the semiconductor fins (3S, 3D, 3B) employing the combination of the gate structures (50, 52, 58), the dummy gate structures (51, 53, 59), the gate spacers 56, and the dummy gate spacers 57 as an implantation mask.

Optionally, a selective epitaxy process can be performed to deposit a semiconductor material on physically exposed semiconductor surfaces. A raised source region 4S can be formed directly on each source region 3S, and a raised drain region 4D can be formed directly on each drain region 3D. Each raised source region 4S is epitaxially aligned to an underlying source region 3S. Each raised drain region 4D is epitaxially aligned to an underlying drain region 3D. The extent of each raised source region 4S is limited by a sidewall of a gate spacer 56 and a sidewall of a dummy gate spacer 57. The extent of each raised drain region 4D can be limited by sidewalls of a pair of gate spacers 56. The lateral extent of the raised source regions 4S and the raised drain regions 4D is controlled to avoid electrical shorts thereamongst. The outer sidewalls surfaces of the raised source regions 4S and the raised drain regions 4D may contact the shallow trench isolation layer 20 only, or may contact top surfaces of the trench top dielectric portions 46, depending on the thickness of the raised source regions 4S and the raised drain region 4D.

Figure 9E:
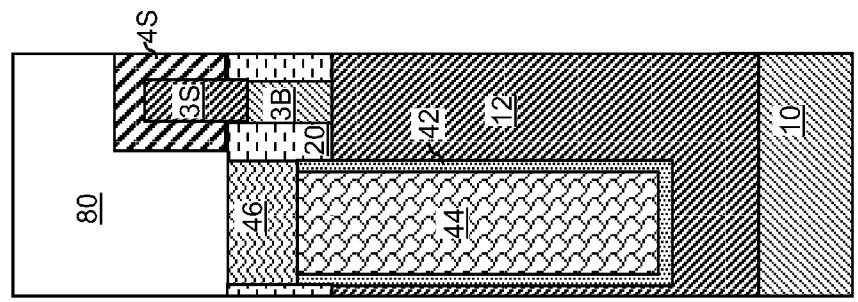
FIG. 9E is a vertical cross-sectional view of the first exemplary semiconductor structure along the vertical plane E-E' in FIG. 9A.
Figure 9D:
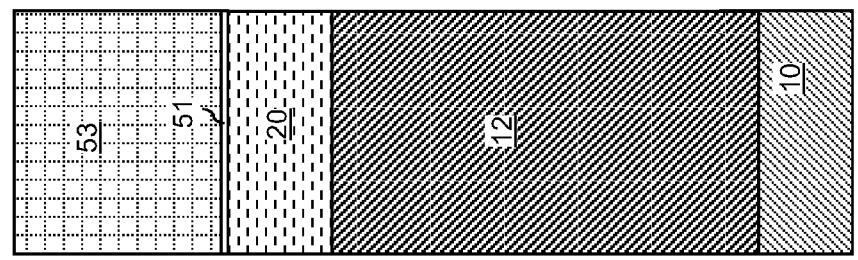
FIG. 9D is a vertical cross-sectional view of the first exemplary semiconductor structure along the vertical plane D-D' in FIG. 9A.
Figure 9C:
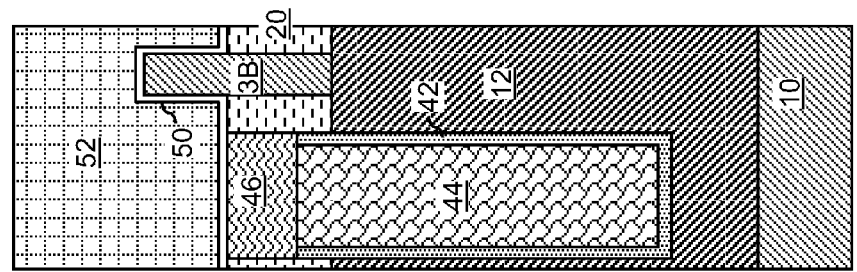
FIG. 9C is a vertical cross-sectional view of the first exemplary semiconductor structure along the vertical plane C-C' in FIG. 9A.

Referring to FIGS. 9A-9E, a planarization dielectric layer 80 is formed over the plurality of semiconductor fins (3S, 3D, 3B), the gate structures (50, 52, 58), and the dummy gate structures (51, 53, 59). The planarization dielectric layer 80 can be formed, for example, by spin-on coating or chemical vapor deposition (CVD) of a dielectric material. The planarization dielectric layer 80 may include a single dielectric material layer, or may include a plurality of dielectric material layers. Excess portions of the deposited dielectric material layer can be removed from above the horizontal plane including the top surface of the gate fill structures 52 and the dummy gate fill structures 53, for example, by chemical mechanical planarization.

In one embodiment, the gate structures (50, 52) can be electrically connected to suitable contact structures (not shown) to become functional gate structures. As used herein, a "functional gate structure" refers to a gate structure that includes a stack of a gate dielectric and a conductive structure in which the gate dielectric contacts a body region of a field effect transistor and the conductive structure functions as a gate electrode to which electrical voltages can be applied to turn on and to turn off the field effect transistor. As used herein, a "functional gate dielectric" is a gate dielectric within a functional gate structure. As used herein, a "functional gate electrode" is a gate electrode within a functional gate structure. In one embodiment, each gate dielectric 50 can be a functional gate dielectric and each gate fill structure 52 can be a functional gate electrode.

In one embodiment, metal interconnect structures including a plurality of dielectric layers, metal lines, and metal via structures can be formed above the top surface of the planarization dielectric layer. In this case, the gate structures (50, 52) can be functional gate structures, and the dummy gate structures (51, 53) can be electrically floating. In one embodiment, all surfaces of the dummy gate fillers 53 can contact dielectric surfaces. For example, each dummy gate filler 53 can be encapsulated by a dummy gate dielectric 51, a dummy gate spacer 57, and a dielectric material layer (not shown) that is subsequently formed on the top surface of the planarization dielectric layer. As used herein, an element is encapsulated by a set of elements if the entire volume of the element is within a volume defined by inner surfaces of the set of elements.

In one embodiment, dielectric surfaces of each dummy gate structure (51, 53) can contact widthwise sidewalls of a neighboring pair of semiconductor fins (3S, 3D, 3B) that are laterally spaced from each other along a lengthwise direction of the semiconductor fins (3S, 3D, 3B).

Figure 10E:
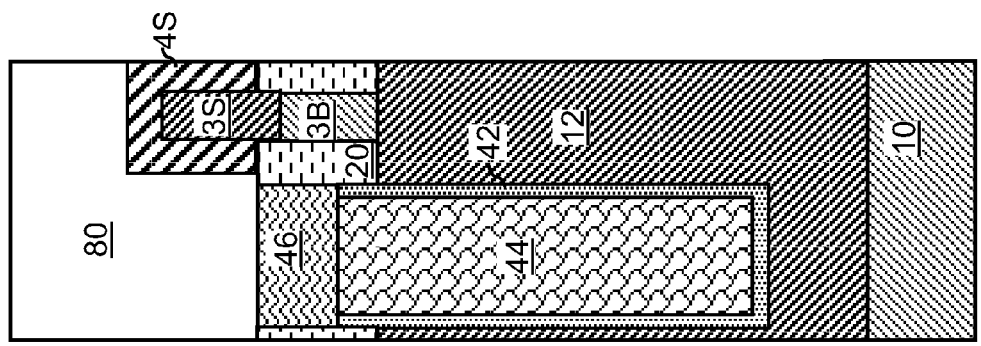
FIG. 10E is a vertical cross-sectional view of the first exemplary semiconductor structure along the vertical plane E-E' in FIG. 10A.
Figure 10D:
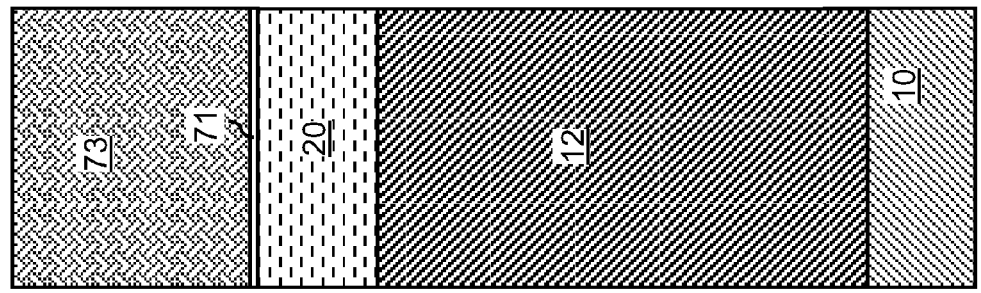
FIG. 10D is a vertical cross-sectional view of the first exemplary semiconductor structure along the vertical plane D-D' in FIG. 10A.
Figure 10C:
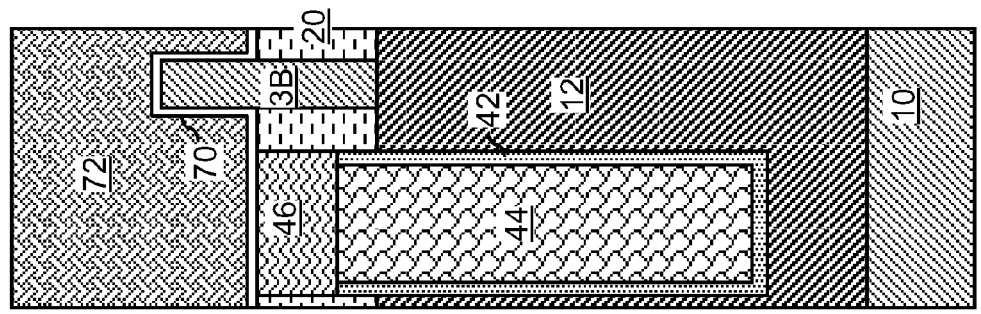
FIG. 10C is a vertical cross-sectional view of the first exemplary semiconductor structure along the vertical plane C-C' in FIG. 10A.

Referring to FIGS. 10A-10E, the gate structures (50, 52) and the dummy gate structures (51, 53) may be replaced with different gate structures and different dummy gate structures prior to forming any metal interconnect structure above the planarization dielectric layer. In this embodiment, the gate structures (50, 52) are disposable gate structures, and the dummy gate structures (51, 53) are disposable dummy gate structures. The different gate structure and the different dummy gate structure are herein referred to as replacement gate structures (70, 72) and replacement dummy gate structures (71, 73), respectively. A replacement gate structure (70, 72) is a functional gate structure, and a dummy replacement gate structure (71, 73) is a non-functional gate structure, i.e. a gate structure that is not a functional gate structure.

The removal of the gate structures (50, 52) and the dummy gate structures (51, 53) can be performed employing at least one etch that is selective to the dielectric material of the planarization dielectric layer 80. Formation of the replacement gate structures (70, 72) and the dummy replacement gate structures (71, 73) can be formed by depositing a gate dielectric layer and a conductive material layer, and removing excess portions of the gate dielectric layer and the conductive material layer from above the top surface of the planarization dielectric layer 80, for example, by chemical mechanical planarization (CMP).

Each remaining portion of the gate dielectric layer filling a cavity formed by removal of a gate structure (50, 52) constitutes a gate dielectric, which is herein referred to as a replacement gate dielectric 70. Each remaining portion of the conductive material layer filling a cavity formed by removal of a gate structure (50, 52) constitutes a gate electrode 72. Each remaining portion of the gate dielectric layer filling a cavity formed by removal of a dummy gate structure (51, 53) constitutes a dielectric liner 71, which has the same composition as the gate dielectrics 70 and is a component of a non-functional gate structure. Each remaining portion of the conductive material layer filling a cavity formed by removal of a dummy gate structure (51, 53) constitutes a conductive material portion 73, which is a fill structure for a non-functional gate structure. The conductive material portion 73 has the same composition as the gate electrode 72.

Each replacement gate structure (70, 72) is a functional gate structure that straddles at least one semiconductor fin 30 and at least one trench capacitor (12, 42, 44). Each replacement gate structure (70, 72) includes a replacement gate dielectric 70 and a gate electrode 72. The replacement dummy gate structures (71, 73) are non-functional gate structures, and extends along the same direction as the replacement gate structures (70, 72), i.e., along the general direction perpendicular to the lengthwise direction of the semiconductor fins (3S, 3D, 3B).

Figure 11E:
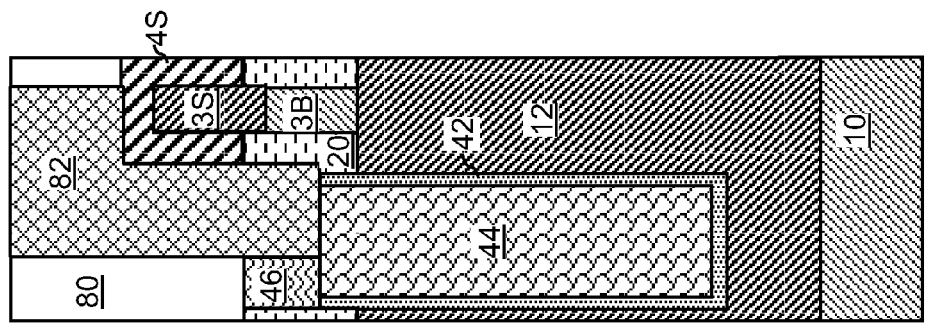
FIG. 11E is a vertical cross-sectional view of the first exemplary semiconductor structure along the vertical plane E-E' in FIG. 11A.
Figure 11D:
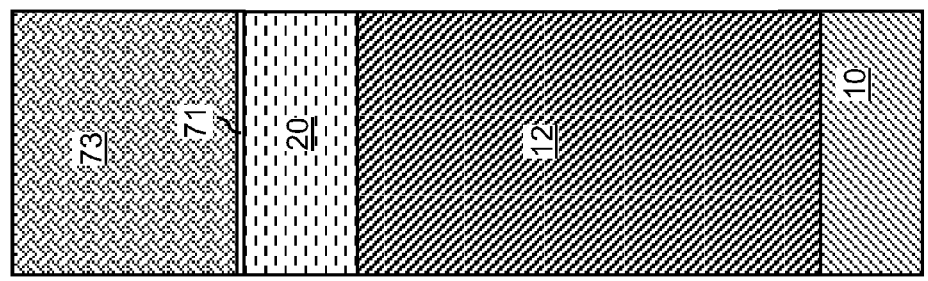
FIG. 11D is a vertical cross-sectional view of the first exemplary semiconductor structure along the vertical plane D-D' in FIG. 11A.
Figure 11C:
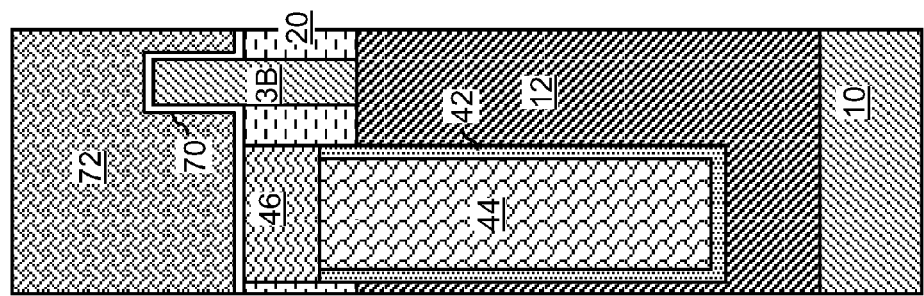
FIG. 11C is a vertical cross-sectional view of the first exemplary semiconductor structure along the vertical plane C-C' in FIG. 11A.

Referring to FIGS. 11A-11E, various conductive structures (82, 84) are formed through the planarization dielectric layer, for example, by formation of via cavities and filling of the via cavities with a conductive material. Formation of the via cavities can be performed by application of a photoresist layer (not shown) above the planarization dielectric layer 80, lithographic patterning of the photoresist layer, and transfer of the pattern in the photoresist layer into the planarization dielectric layer 80 by an anisotropic etch such as a reactive ion etch. The via cavities can be filled with the conductive material by chemical vapor deposition or physical vapor deposition, and excess portions of the conductive material can be removed from above the top surface of the planarization dielectric layer 80 by chemical mechanical planarization.

The various conductive structures (82, 84) can include contact via structures 84 that contact the raised drain regions 4D and/or the drain regions 3D. Further, the various conductive structures (82, 84) can include conductive strap structures 82. Each conductive strap structure 82 can electrically short a source region 3S in the one of the semiconductor fins (3S, 3D, 3B) and an inner electrode 44 in one of the trench capacitors (12, 42, 44). Each conductive strap structure 82 can be formed as a self-aligned structure laterally bounded by a gate spacer 56 and a dummy gate spacer 57. Thus, sidewalls of each conductive strap structure 82 can contact a gate spacer 56 and a dummy gate spacer 57.

The first exemplary semiconductor structure includes semiconductor fins (3S, 3D, 3B) located on a substrate (which includes the semiconductor material layer 10 and the buried plates 12). Each of the semiconductor fins (3S, 3D, 3B) is laterally bound by a pair of lengthwise sidewalls and a pair of widthwise sidewalls. The first exemplary semiconductor structure further includes trench capacitors (12, 42, 44) located within the substrate. An inner electrode 44 of each trench capacitor (12, 42, 44) is electrically shorted to a source region 3S in one of the semiconductor fins (3S, 3D, 3B).

Each replacement gate structure (70, 72) straddles one of the semiconductor fins (3S, 3D, 3B), and includes a stack of a gate dielectric, i.e., a replacement gate dielectric 70, and a gate electrode 72. A gate spacer 56 laterally surrounding the replacement gate dielectric 70 and the gate electrode 72. Each replacement dummy gate structure (71, 73) includes dielectric surfaces located between a widthwise sidewall of one of the semiconductor fins (3S, 3D, 3B) and a widthwise sidewall of another of the semiconductor fins (3S, 3D, 3B). The replacement dummy gate structures (71, 73) can laterally extend along the same direction as the replacement gate structures (70, 72). Each dummy gate spacer 57 laterally surrounds a replacement dummy gate structure (71, 73), and has the same composition and lateral thickness as the gate spacers 56. The shallow trench isolation layer 20 is in contact with the bottom surface of the replacement dummy gate structures (71, 73).

Figure 12E:
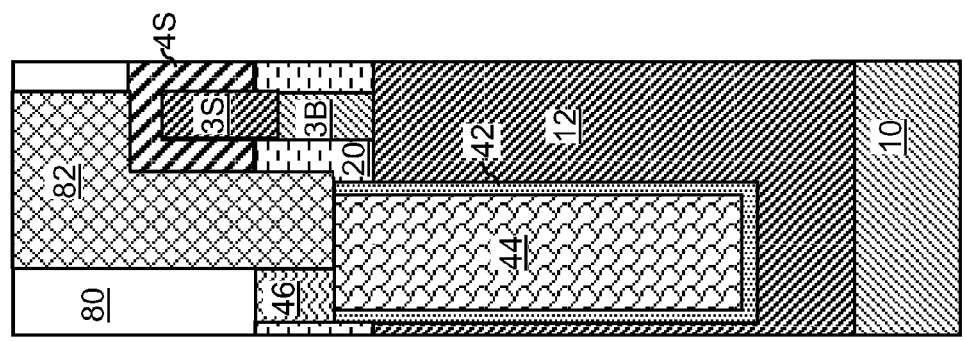
FIG. 12E is a vertical cross-sectional view of the second exemplary semiconductor structure along the vertical plane E-E' in FIG. 12A.
Figure 12D:
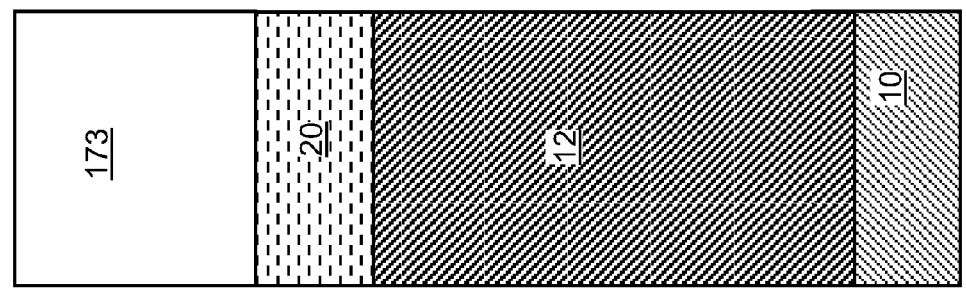
FIG. 12D is a vertical cross-sectional view of the second exemplary semiconductor structure along the vertical plane D-D' in FIG. 12A.
Figure 12C:
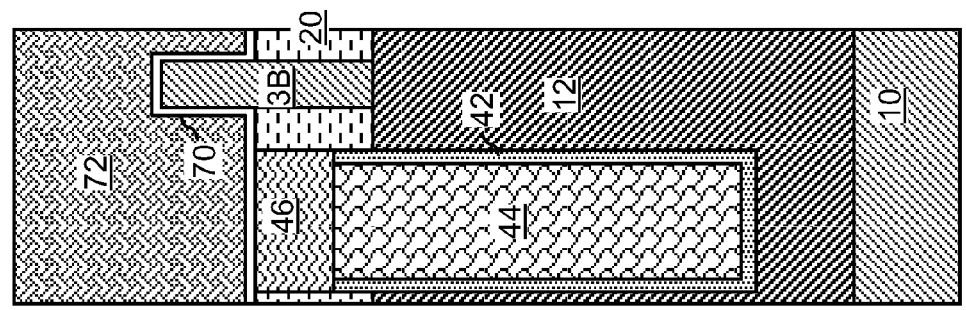
FIG. 12C is a vertical cross-sectional view of the second exemplary semiconductor structure along the vertical plane C-C' in FIG. 12A.

Referring to FIGS. 12A-12E, a second exemplary semiconductor structure according to a second embodiment of the present disclosure can be derived from the first exemplary semiconductor structure of FIGS. 10A-10E or FIGS. 11A-11E by replacing the replacement dummy gate structures (71, 73) with different dummy gate structures 173. Each dummy gate structure 173 is a dielectric material portion, which replaces a combination of a dielectric liner 71 and a conductive material portion 73.

The replacement dummy gate structures (71, 73; See FIGS. 11A-11E) can be removed by masking the replacement gate structures (70, 72) with a masking layer, etching the conductive material portions 73 with an etchant that is selective to the planarization dielectric layer 80 and the dielectric material of the disposable gate spacers 57. The dielectric liners 71 may, or may not, be removed. A dielectric material can be deposited into cavities from which the conductive material portions 73 are removed. Excess portions of the deposited dielectric material can be removed from above the top surface of the planarization dielectric layer 80 to form the dummy gate structures 173. If the dielectric liners 71 are not removed, the dielectric liners 71 can be incorporated into the dummy gate structures 173.

The dummy gate structure 173 is formed directly on the top surface of the shallow trench isolation layer 20, and can contact widthwise sidewalls of the semiconductor fins (3S, 3D, 3B). In one embodiment, the dummy gate structures 173 can include a dielectric material portion including a different material than the replacement gate dielectrics 70. In one embodiment, each dummy gate structure 173 can consist of the dielectric material portion having a same composition throughout. If the dielectric liners 71 are not removed, each dummy gate structure 173 can include a dielectric liner having a same composition than the gate dielectrics 70, and an insulator material portion contacting inner sidewalls of dummy gate spacers 57.

If the second exemplary semiconductor structure is derived from the first exemplary semiconductor structure of FIGS. 11A-11E, the processing steps of FIGS. 12A-12E can be subsequently performed.

Figure 13E:
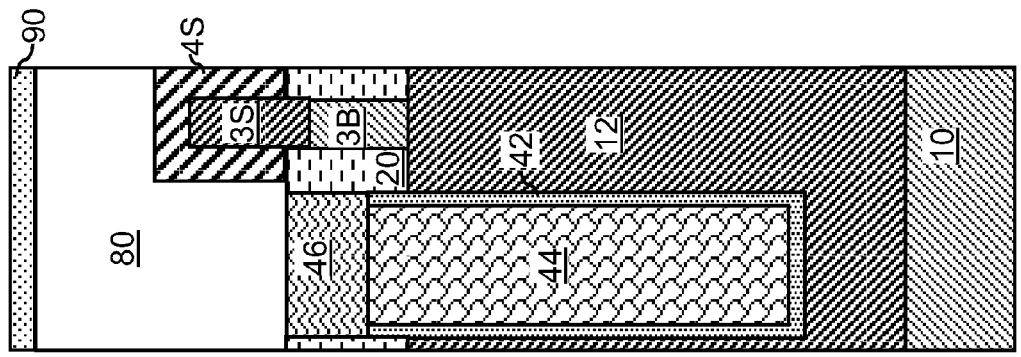
FIG. 13E is a vertical cross-sectional view of the third exemplary semiconductor structure along the vertical plane E-E' in FIG. 13A.
Figure 13D:
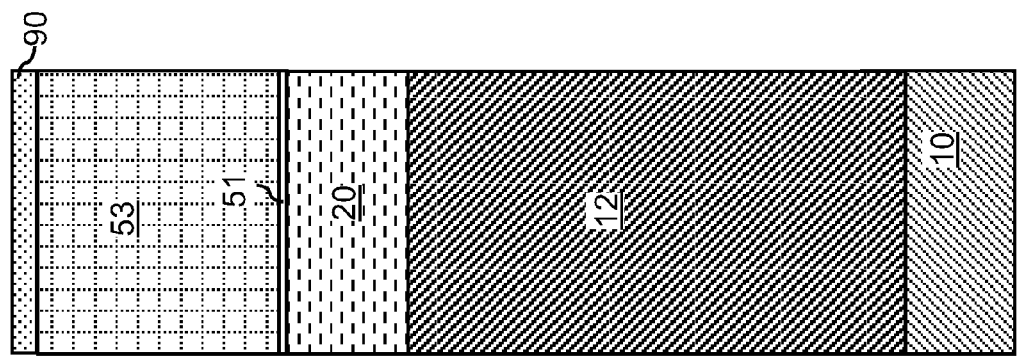
FIG. 13D is a vertical cross-sectional view of the third exemplary semiconductor structure along the vertical plane D-D' in FIG. 13A.
Figure 13C:
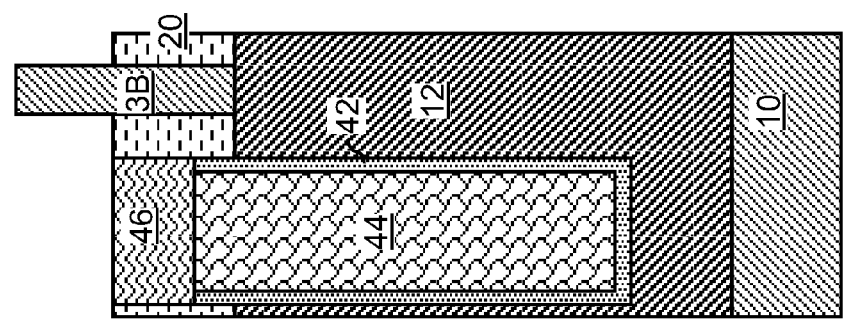
FIG. 13C is a vertical cross-sectional view of the third exemplary semiconductor structure along the vertical plane C-C' in FIG. 13A.

Referring to FIGS. 13A-13E, a third exemplary semiconductor structure according to a third embodiment of the present disclosure can be derived from the first exemplary structure of FIGS. 9A-9E by forming a mask layer 90 to mask the dummy gate structures (51, 53) and by removing the gate structures (50, 52). In this embodiment, the gate structures (50, 52) are non-functional gate structures, and the dummy gate structures (51, 53) remain in a packaged semiconductor chip as a permanent structure.

The mask layer 90 can be a soft mask layer including an organic material (such as a photoresist layer), or can be a hard mask layer including a dielectric material such as silicon nitride, silicon oxide, a dielectric metal oxide layer, or a dielectric metal nitride layer. The etch chemistry for removal of the dummy gate structures (51, 53) can be selective to the dielectric material of the gate spacers 56 and the semiconductor material of the semiconductor fins (3S, 3D, 3B).

Figure 14E:
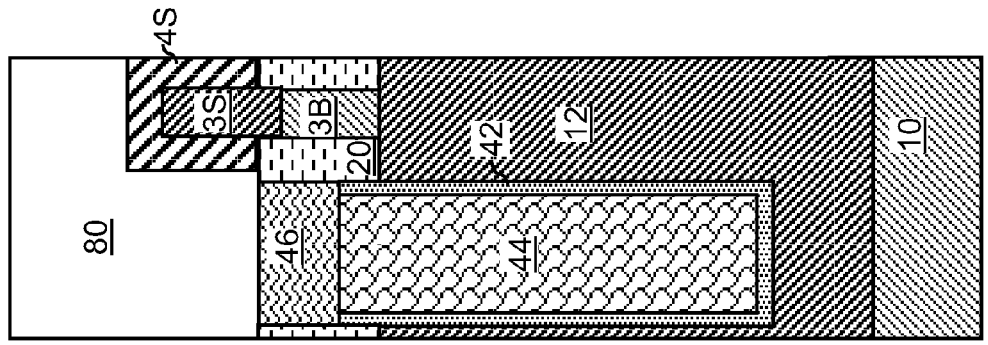
FIG. 14E is a vertical cross-sectional view of the fourth exemplary semiconductor structure along the vertical plane E-E' in FIG. 14A.
Figure 14D:
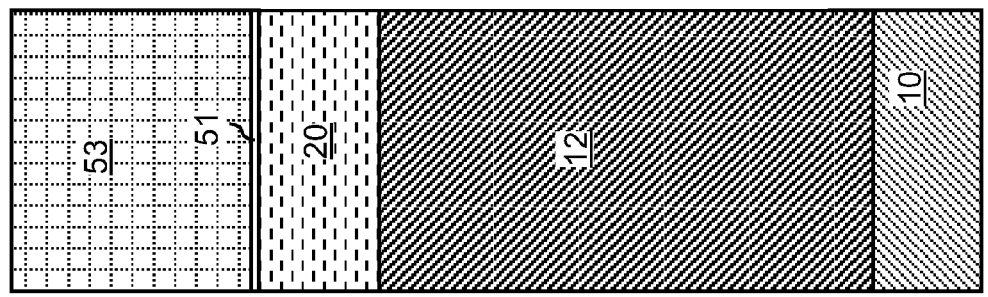
FIG. 14D is a vertical cross-sectional view of the fourth exemplary semiconductor structure along the vertical plane D-D' in FIG. 14A.
Figure 14C:
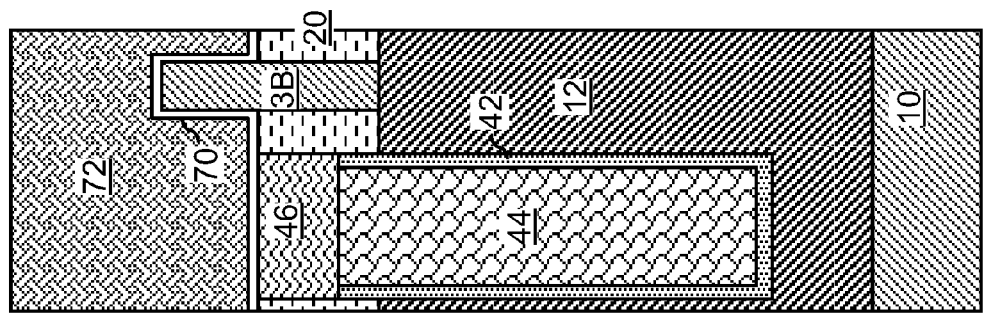
FIG. 14C is a vertical cross-sectional view of the fourth exemplary semiconductor structure along the vertical plane C-C' in FIG. 14A.

Referring to FIGS. 14A-14E, replacement gate structures (70, 72) are formed in the gate cavities from which the gate structures (50, 52) are removed. Formation of the replacement gate structures (70, 72) and the dummy replacement gate structures (71, 73) can be formed by depositing a gate dielectric layer and a conductive material layer, and removing excess portions of the gate dielectric layer and the conductive material layer from above the top surface of the planarization dielectric layer 80 by a planarization process, which can be, for example, a chemical mechanical planarization (CMP) process. In one embodiment, the mask layer 90 can be removed during the planarization process.

Each remaining portion of the gate dielectric layer filling the gate cavities constitutes a gate dielectric, which is herein referred to as a replacement gate dielectric 70. Each remaining portion of the conductive material layer filling the gate cavities constitutes a gate electrode 72. Each replacement gate structure (70, 72) is a functional gate structure that straddles at least one semiconductor fin 30 and at least one trench capacitor (12, 42, 44). Each replacement gate structure (70, 72) includes a replacement gate dielectric 70 and a gate electrode 72. The dummy gate structures (51, 53) are non-functional gate structures, and extends along the same direction as the replacement gate structures (70, 72), i.e., along the general direction perpendicular to the lengthwise direction of the semiconductor fins (3S, 3D, 3B).

In one embodiment, the material of the replacement gate dielectrics 70 can be different from the material of the gate dielectrics 50. In this case, each dummy gate structure (51, 53) includes a dielectric liner (i.e., a dummy gate dielectric 51) containing a different material than the replacement gate dielectrics 70, which are the gate dielectrics of functional gate structures.

The dummy gate fill structures 53 can include a dielectric material or a conductive material. If the dummy gate fill structures 53 include a dielectric material, the dummy gate fill structures 53 are insulator material portions. If the dummy gate fill structures 53 include a conductive material, the dummy gate fill structures 53 can include a different conductive material than the gate electrode 72.

Referring to FIGS. 15A and 15B, a variation of the first exemplary semiconductor structure according to the first embodiment of the present disclosure can be derived from the first exemplary semiconductor structure by forming narrower dummy gate structures (51, 53) at the processing steps of FIG. 7A-7E. Correspondingly, the replacement dummy gate structures (71, 73) are narrower than the counterparts illustrated in FIGS. 10A-10E. In this case, the replacement dummy gate structures (71, 73) contact the shallow trench isolation layer 20, and does not contact the widthwise sidewalls of the semiconductor fins (3S, 3D, 3B). The dummy gate spacers 57 contact the widthwise sidewalls of the semiconductor fins (3S, 3D, 3B).

Referring to FIGS. 16A and 16B, a variation of the first exemplary semiconductor structure according to the second embodiment of the present disclosure can be derived from the variation of the first exemplary semiconductor structure illustrated in FIGS. 15A and 15B by performing the processing steps of FIGS. 12A-12E. The dummy gate structures 173 in FIGS. 16A and 16B are narrower than the counterparts illustrated in FIGS. 12A-12E. In this case, the dummy gate structures 173 contact the shallow trench isolation layer 20, and does not contact the widthwise sidewalls of the semiconductor fins (3S, 3D, 3B). The dummy gate spacers 57 contact the widthwise sidewalls of the semiconductor fins (3S, 3D, 3B).

Referring to FIGS. 17A and 17B, a variation of the third exemplary semiconductor structure according to the first embodiment of the present disclosure can be derived from the third exemplary semiconductor structure by forming narrower dummy gate structures (51, 53) at the processing steps of FIG. 7A-7E. In this case, the dummy gate structures (51, 53) contact the shallow trench isolation layer 20, and does not contact the widthwise sidewalls of the semiconductor fins (3S, 3D, 3B). The dummy gate spacers 57 contact the widthwise sidewalls of the semiconductor fins (3S, 3D, 3B).

The various embodiments of the present disclosure employ dummy gate structures to confine the growth of raised source regions along the lengthwise direction of the semiconductor fins, thereby preventing electrical short between neighboring pairs of raised source regions. Further, conductive strap structures that provide electrical contact between the inner electrodes of trench capacitors and the source regions can be formed as self-aligned structures laterally confined between an outer sidewall of a gate spacer and an outer sidewall of a dummy gate spacer, thereby preventing electrical shorts between a neighboring pair of conductive strap structures.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
semiconductor fins located on a substrate, wherein each of said semiconductor fins is laterally bound by a pair of lengthwise sidewalls and a pair of widthwise sidewalls;
trench capacitors located within said substrate, wherein an inner electrode of each trench capacitor is electrically shorted to a source region in one of said semiconductor fins;
a gate structure straddling one of said semiconductor fins and overlying one of said trench capacitors, said gate structure comprising a stack of a gate dielectric and a gate electrode;
a gate spacer laterally surrounding said gate dielectric and said gate electrode; and
a dummy gate structure including dielectric surfaces located between a widthwise sidewall of one of said semiconductor fins and a widthwise sidewall of another of said semiconductor fins, and between a sidewall of one of said trench capacitors and a sidewall of another of said trench capacitors, said dummy gate structure laterally extending along a same direction as said gate structure.

2. The semiconductor structure of claim 1, further comprising a dummy gate spacer laterally surrounding said dummy gate structure, wherein said dummy gate spacer is in contact with said widthwise sidewall of said semiconductor fins and said widthwise sidewall of said another of said semiconductor fins, and said dielectric surfaces are provided by said dummy gate spacer.

3. The semiconductor structure of claim 2, wherein said dummy gate spacer has a same composition and a same lateral thickness as said gate spacer.

4. The semiconductor structure of claim 2, wherein said dummy gate structure comprises:
a dielectric liner having a same thickness and a same composition as said gate dielectric; and
a conductive material portion having a same composition as said gate electrode and embedded within said dielectric liner.

5. The semiconductor structure of claim 2, wherein said dummy gate structure comprises a dielectric material portion including a different material than said gate dielectric, wherein said dielectric material portion is in contact with said widthwise sidewall of said semiconductor fins and said widthwise sidewall of said another of said semiconductor fins, and said dielectric surfaces are provided by said dielectric material portion.

6. The semiconductor structure of claim 5, wherein an entirety of said dummy gate structure consists of said dielectric material portion.

7. The semiconductor structure of claim 5, wherein said dummy gate structure comprises:
a dielectric liner having a different composition than said gate dielectric; and
an insulator material portion contacting inner sidewalls of said dummy gate spacer.

8. The semiconductor structure of claim 2, further comprising:
a source region located within said one of said semiconductor fins and contacting said dummy gate structure; and
a raised source region contacting sidewalls and a top surface of said source region and a sidewall of said gate spacer and a sidewall of said dummy gate spacer.

9. The semiconductor structure of claim 2, further comprising a conductive strap structure electrically shorting a source region in said one of said semiconductor fins and an inner electrode in one of said trench capacitors and contacting said dummy gate spacer.

10. The semiconductor structure of claim 1, further comprising a shallow trench isolation layer in contact with a bottom surface of said dummy gate structure.

* * * * *